(12) United States Patent
Van Liere

(10) Patent No.: US 12,078,698 B2
(45) Date of Patent: Sep. 3, 2024

(54) MAGNETIC RESONANCE IMAGING RECEIVE ANTENNA

(71) Applicant: KONINKLIJKE PHILIPS N.V., Eindhoven (NL)

(72) Inventor: Filips Van Liere, Best (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/766,747

(22) PCT Filed: Sep. 24, 2020

(86) PCT No.: PCT/EP2020/076642
§ 371 (c)(1),
(2) Date: Apr. 6, 2022

(87) PCT Pub. No.: WO2021/069217
PCT Pub. Date: Apr. 15, 2021

(65) Prior Publication Data
US 2024/0085503 A1    Mar. 14, 2024

(30) Foreign Application Priority Data

Oct. 10, 2019 (EP) .................................... 19202384

(51) Int. Cl.
*G01R 33/36* (2006.01)
*G01R 33/54* (2006.01)
*G01R 33/561* (2006.01)

(52) U.S. Cl.
CPC ..... *G01R 33/3621* (2013.01); *G01R 33/3692* (2013.01); *G01R 33/543* (2013.01); *G01R 33/5611* (2013.01)

(58) Field of Classification Search
CPC ............ G01R 33/3621; G01R 33/3692; G01R 33/543; G01R 33/5611; G01R 33/3415
See application file for complete search history.

(56) References Cited

U.S. PATENT DOCUMENTS 5,345,175 A * 9/1994 Kasuboski ......... G01R 33/4828
324/309
2004/0193038 A1   9/2004 Reykowski et al.
(Continued)

OTHER PUBLICATIONS

International Search Report and Written Opinion from PCT/EP2020/076642 mailed Dec. 22, 2020.

*Primary Examiner* — Rodney A Bonnette

(57) ABSTRACT

Disclosed herein is a medical instrument comprising (100, 200, 400) a magnetic resonance imaging receive antenna (101, 101'). The magnetic resonance imaging receive antenna comprises multiple antenna elements (102) each configured for receiving a magnetic resonance imaging radio-frequency signal. The magnetic resonance imaging receive antenna further comprises a radio-frequency receiver (104) connected to each of the multiple antenna elements, wherein the radio-frequency receiver is configured to receive the magnetic resonance imaging radio frequency signal and to convert the radio frequency signal to digital magnetic resonance data (902). The magnetic resonance imaging receive antenna further comprises a digital combiner (108). The digital combiner is configured to combine a weighted combination of the digital magnetic resonance data from each of the radio frequency signals into a chosen number of digital virtual magnetic resonance channels using a set of weighting factors (904). The magnetic resonance imaging receive antenna further comprises a first digital communication transceiver (110) configured for transmitting the digital virtual magnetic resonance channels via a digital communication channel (112).

18 Claims, 14 Drawing Sheets

(56) References Cited

U.S. PATENT DOCUMENTS

| | | |
|---|---|---|
| 2007/0069727 A1 | 3/2007 | Schulz et al. |
| 2008/0211498 A1* | 9/2008 | Dannels ............ G01R 33/3415 |
| | | 324/309 |
| 2010/0013472 A1 | 1/2010 | Buehrer et al. |
| 2010/0244825 A1 | 9/2010 | Brau et al. |
| 2011/0006766 A1 | 1/2011 | Jurrissen et al. |
| 2011/0101977 A1 | 5/2011 | Nakanishi et al. |
| 2012/0112751 A1* | 5/2012 | Littmann ......... G01R 33/56545 |
| | | 324/322 |
| 2013/0082706 A1 | 4/2013 | Evers et al. |
| 2014/0340083 A1 | 11/2014 | Zhang et al. |
| 2015/0091570 A1 | 4/2015 | Gross et al. |
| 2017/0045599 A1 | 2/2017 | Cauley et al. |
| 2017/0180026 A1 | 6/2017 | Flynn et al. |

* cited by examiner

MAGNETIC RESONANCE IMAGING RECEIVE ANTENNA

CROSS REFERENCE TO RELATED APPLICATIONS

This application is a U.S. national phase application of International Application No. PCT/EP2020/076642 filed on Sep. 24, 2020, which claims the benefit of EP Application Serial No. 19202384.4 filed on Oct. 10, 2019 and is incorporated herein by reference.

FIELD OF THE INVENTION

The invention relates to Magnetic Resonance Imaging, in particular to magnetic resonance imaging receive antennas.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the BO field or the main magnetic field. Various quantities or properties of the subject can be measured spatially using MRI. Magnetic resonance imaging transmit antennas are used to transmit radio frequency pulses that can be used to manipulate the orientation of the nuclear spins. The nuclear spins then emit radio-frequency signals that are received by magnetic resonance imaging receive antennas.

United States patent application US 2010/0244825 discloses a method for generating a magnetic resonance (MR) image includes acquiring calibration data from each of a plurality of RF source coils. Calibration data for a virtual coil is generated based on the calibration data from the plurality of RF source coils and a set of synthesis weights is generated based on the calibration data from the plurality of RF source coils and the calibration data for the virtual coil. Accelerated MR data is acquired from each of the plurality of RF source coils. An image can be reconstructed based on an application of the set of synthesis weights to the accelerated MR data from the plurality of RF source coils.

SUMMARY OF THE INVENTION

The invention provides for a medical instrument, a method, and a computer program product in the independent claims. Embodiments are given in the dependent claims.

Recently the number of receive channels for magnetic resonance imaging systems has been increasing. For example, surface coils, also referred to as surface antennas, are an example of a magnetic resonance receive antenna. Such surface coils have had an increasing number of antenna elements integrated into them. This can cause several difficulties. One potential difficulty is that there may be large bandwidth requirements to transmit the magnetic resonance imaging data back to the magnetic resonance imaging system. Another potential difficulty is that an increasingly large amount of data needs to be stored by the magnetic resonance imaging system to perform the reconstruction of a magnetic resonance image.

For example, the digital combiner may be integrated with the antenna elements in that disposed on a common substrate or carrier with the antenna elements. The digital combiner may also be directly connected to the set of receive antenna elements. The set of receive antenna elements may be embodied as an array of antenna elements and the digital combiner integrated in the array of antenna element on a common carrier or directly mounted adjacent to the antenna elements. This achieves that the output of the antenna array has only a few, may be only a single one, digital output channels, the number of digital output channels being (far) less than the number of antenna elements. Also the radio frequency receivers for the antenna elements and the first digital communication transceiver may be integrated with the antenna elements by disposing them on a common substrate or mount adjacent to the antenna elements Embodiments may provide for a means of reducing bandwidth by using several measures. Firstly, the magnetic resonance imaging data can be transmitted from the magnetic resonance imaging coil in digital form to the magnetic resonance imaging system. This reduces the number of radio-frequency connections to the antenna. Secondly, the magnetic resonance imaging signal received by each antenna element can be combined within the antenna itself into a reduced number of virtual magnetic resonance imaging channels, referred to herein as digital virtual magnetic resonance imaging channels. This may result in a reduction in the amount of magnetic resonance data that needs to be transmitted and/or stored while maintaining image quality.

In one aspect the invention provides for a medical instrument that comprises a magnetic resonance imaging receive antenna. The magnetic resonance imaging receive antenna comprises multiple antenna elements each configured for receiving a magnetic resonance imaging radio-frequency signal. The magnetic resonance imaging receive antenna further comprises a radio-frequency receiver connected to each of the multiple antenna elements, that is to say each of the multiple antenna elements has its own radio-frequency receiver. The radio-frequency receiver is configured to receive the magnetic resonance imaging radio-frequency signal and to convert the radio-frequency signal to digital magnetic resonance data. The magnetic resonance imaging receive antenna further comprises a digital combiner. The digital combiner is configured to combine a weighted combination of the digital magnetic resonance data from each of the radio-frequency signals into a chosen number of digital virtual magnetic resonance channels using a set of weighting factors.

In magnetic resonance imaging the concept of combining data from different antenna elements of the magnetic resonance imaging antenna is known as using virtual coils. The digital virtual magnetic resonance channels may be considered to be virtual coils or coil antenna elements.

The magnetic resonance imaging receive antenna further comprises a first digital communication transceiver configured for transmitting the digital virtual magnetic resonance channels via a digital communication channel.

This embodiment may have the benefit that the data from the multiple antenna elements are combined into the digital virtual magnetic resonance channels before they are transmitted across the digital communication channel. This embodiment may be beneficial because this may be used for reducing the bandwidth of data transmitted by the magnetic resonance imaging receive antenna. A current trend is to greatly increase the number of antenna elements of a magnetic resonance imaging receive coil. A difficulty is that this requires large amounts of data to be transmitted. Another difficulty is that large amounts of data need to be stored or archived within the magnetic resonance imaging system. By outsourcing the combination of this data into virtual channels this not only reduces the amount of data that needs to be transmitted but also reduces the load on the magnetic resonance imaging system and storage systems.

The first digital communications transceiver may use a multiplexer to transmit the data from the different digital virtual magnetic resonance channels. For example, this technique may be referred to as time division multiplexing or TDM.

In another embodiment, the digital communication channel is a serial communication channel.

In another embodiment the medical imaging system further comprises a magnetic resonance imaging system configured for acquiring magnetic resonance data from an imaging zone. The magnetic resonance imaging system comprises a second intermediate digital communication transceiver configured for forming the digital communication channel with the first digital communication transceiver. The magnetic resonance imaging system is configured for receiving the digital virtual magnetic resonance channels via the digital communication channel. The data received from the digital virtual magnetic resonance channels via the digital communication channel may form at least a portion of the magnetic resonance data that is acquired by the magnetic resonance imaging system.

This embodiment may be beneficial because it may provide for a magnetic resonance imaging system that reduces the amount of bandwidth that is transmitted and stored from the magnetic resonance imaging receive antenna while preserving the image quality.

In another embodiment the magnetic resonance imaging system further comprises a memory configured for storing machine-executable instructions. The magnetic resonance imaging system further comprises a processor configured for controlling the medical instrument. Execution of the machine-executable instructions causes the processor to control the magnetic resonance imaging system to measure coil sensitivity data for each of the multiple antenna elements by controlling the magnetic resonance imaging system with coil sensitivity pulse sequence commands. The coil sensitivity data is received via the digital communication channel. In this case the coil sensitivity data is the digital magnetic resonance data from each of the multiple antenna elements.

Execution of the machine-executable instructions further causes the processor to determine a coil sensitivity profile for each of the multiple antenna elements using the coil sensitivity data. The measurement of the coil sensitivity data and determination of the coil sensitivity profile is a standard technique and is often referred to as parallel imaging. Examples of parallel imaging techniques are SENSE and GRAPPA.

Execution of the machine-executable instructions further cause the processor to receive a chosen field of view, a chosen pulse sequence for controlling the magnetic resonance imaging to acquire the digital magnetic resonance data, and an available bandwidth limit. The choice of the chosen field of view as well as the pulse sequence affect how much data is generated by the magnetic resonance imaging receive antennas. The available bandwidth limit may be based on a variety of different factors. One may be the number of receive antennas which are connected to the magnetic resonance imaging system. With a larger number of antennas, the amount of data which can be used by a particular magnetic resonance imaging receive antenna may be reduced. The available bandwidth limit may also be based on a desire to control the amount of data which is stored and processed by the processor of the magnetic resonance imaging system.

Execution of the machine-executable instructions further cause the processor to determine the chosen number of digital virtual magnetic resonance channels using the chosen field of view, the chosen pulse sequence, and the available bandwidth limit. Given the amount of available bandwidth and the chosen field of view and chosen pulse sequence the number of digital virtual magnetic resonance channels can be determined. After this execution of the machine-executable instructions further cause the processor to determine a set of calculated weighting factors using the chosen number of digital virtual magnetic resonance channels and the coil sensitivity profile of each of the multiple antenna elements to construct a set of virtual magnetic resonance channels. The coil sensitivity profile for each of the multiple antenna elements essentially relates to the region that the particular antenna element images well. This may therefore be used to construct the virtual magnetic resonance channels.

Execution of the machine-executable instructions further causes the processor to transmit the set of calculated weighting factors to the magnetic resonance imaging receive antenna using the digital communication channel. The magnetic resonance imaging receive antenna is configured for setting the set of calculated weighting factors as the set of weighting factors upon receipt via the digital communication channel. In this step the set of calculated weighting factors is used to configure the magnetic resonance imaging receive antenna for the particular field of view and the chosen pulse sequence.

This embodiment may have the benefit that the digital virtual magnetic resonance channels are constructed such that for a particular field of view and pulse sequence they do not have a negative effect on the image quality.

The available bandwidth limit may be referred to herein as the digital communication channel bandwidth allotted for the transfer of acquired data in some embodiments.

In another embodiment the medical instrument further comprises multiple ones of the magnetic resonance imaging receive antenna. The available bandwidth is at least partially determined by a bandwidth requirement of the multiple ones of the magnetic resonance imaging receive antenna.

In another embodiment execution of the machine-executable instructions further causes the processor to control the magnetic resonance imaging system with the chosen pulse sequence commands to acquire the magnetic resonance data. The magnetic resonance data comprises the weighted combination of the digital magnetic resonance data received via the digital communication channel. Execution of the machine-executable instructions further causes the processor to reconstruct a magnetic resonance image using the magnetic resonance data.

This embodiment may be beneficial because it may provide for a magnetic resonance image to reduce data transfer requirements but maintains its resolution and quality.

In another embodiment execution of the machine-executable instructions further cause the processor to control the magnetic resonance imaging system to measure channel noise data for each digital magnetic resonance channel by controlling the magnetic resonance imaging system with channel noise pulse sequence commands. The channel noise data is received via the digital communication channel. For example, the channel noise pulse sequence commands may be a pulse sequence command that is the same or similar to the chosen pulse sequence commands with the radio frequency generator or transmitter turned off, so in this case only a background noise is measured.

Execution of the machine-executable instructions further cause the processor to determine noise correlations between each digital virtual magnetic resonance channel and using the channel noise data. The noise correlations for example may be calculated by calculating correlation coefficients between each of the digital magnetic resonance channels using the channel noise data. Execution of the machine-executable instructions further cause the processor to determine noise decorrelation coefficients for each digital magnetic resonance channel using the noise correlations. The noise correlation coefficients may be combinations of channels which are used to reduce the correlation of noise.

In another embodiment the processor is configured such that calculating the set of calculated weighting factors to construct the set of virtual magnetic resonance channels is formed at least partially using the noise-to-correlation coefficients. For example, the set of virtual magnetic resonance channels may be set up such that noise correlations are reduced.

In another embodiment execution of the machine-executable instructions further causes the processor to modify the set of calculated weighting factors with the noise decorrelation coefficients to perform a noise-to-correlation using the digital combiner. This embodiment may be beneficial because it may reduce the amount of noise in the acquired magnetic resonance data. The coefficients to perform the noise decorrelation may be combined with the set of weighting factors to perform the separation of data into the virtual channels as well as reduce the amount of noise simultaneously.

In another embodiment the first digital communication transceiver and the second intermediate digital communication transceiver is configured for forming the digital communication channel using any one of the following: a fiber optic cable, a wireless communication channel, a Wi-Fi connection, a Bluetooth connection, and a galvanic digital serial cable. Any of these embodiments used may be beneficial because they may enable placing the magnetic resonance imaging receive antenna within the magnetic resonance imaging system.

In another embodiment the magnetic resonance imaging receive antenna comprises a battery for powering the digital combiner. This embodiment may be beneficial because then it is completely separate from the electronics of the magnetic resonance imaging system except for the hardware used for the digital communication channel.

In another embodiment the magnetic resonance imaging receive antenna is a surface antenna. The surface antenna may also be commonly referred to as a surface coil. This embodiment may be beneficial because a current trend is to greatly increase the number of the antenna elements in a surface antenna. Embodiments may therefore contain the benefit of an increased number of antenna elements for a surface antenna while simultaneously reducing the bandwidth requirements for transmitting digital data.

In another embodiment the digital combiner is implemented using an application-specific integrated circuit.

In another embodiment the digital combiner is implemented using a field-programmable gate array.

In another embodiment the digital combiner is implemented using a microprocessor.

In another embodiment the weighting factors are complex. The use of complex weighting factors may be beneficial because then the weighting factors can be used to correct for the signal phase of the measurements. The use of the complex weighting factors preserves phase information in the magnetic resonance signal. In this case the sensitivity profiles may also be complex valued functions.

In another aspect the invention provides for a computer program product comprising machine-executable instructions for execution by a processor controlling the medical instrument. The medical instrument comprises the magnetic resonance imaging receive antenna. The magnetic resonance imaging receive antenna comprises multiple antenna elements each configured for receiving a magnetic resonance imaging radio-frequency signal. The magnetic resonance imaging receive antenna further comprises a radio-frequency receiver connected to each of the multiple antenna elements. The radio-frequency receiver is configured to receive the magnetic resonance imaging radio-frequency signal and to convert the magnetic resonance imaging radio-frequency signal to digital magnetic resonance data.

The magnetic resonance imaging receive antenna further comprises a digital combiner. The digital combiner is configured to combine a weighted combination of the digital magnetic resonance data from each of the radio-frequency signal into a chosen number of digital virtual magnetic channels using a set of weighting factors. The magnetic resonance imaging receive antenna further comprises a first digital communication transceiver configured for transmitting the digital virtual magnetic resonance channels via a digital communication channel. The digital communication channel is a serial communication channel.

The medical instrument further comprises a magnetic resonance imaging system configured for acquiring magnetic resonance data from an imaging zone. The magnetic resonance imaging system comprises a second intermediate digital communication transceiver configured for forming the digital communication channel with the first digital communication receiver. The magnetic resonance imaging system is configured for receiving the digital virtual magnetic resonance channels via the digital communication channel.

Execution of the machine-executable instructions causes the processor to control the magnetic resonance imaging system to measure coil sensitivity data for each of the multiple antenna elements by controlling the magnetic resonance imaging system with coil sensitivity pulse sequence commands. The coil sensitivity data is received via the digital communication channel. Execution of the machine-executable instructions further cause the processor to determine a coil sensitivity profile for each of the multiple antenna elements using the coil sensitivity data. Execution of the machine-executable instructions further cause the processor to receive a chosen field of view, a chosen pulse sequence for controlling the magnetic resonance imaging system to acquire the digital magnetic resonance data, and an available bandwidth limit.

Execution of the machine-executable instructions further cause the processor to determine the chosen number of digital virtual magnetic resonance channels using the chosen field of view, the chosen pulse sequence, and the available bandwidth limit. Execution of the machine-executable instructions further cause the processor to determine a set of calculated weighting factors using the chosen number of digital virtual magnetic resonance channels and the coil sensitivity profile for each of the multiple antenna elements to construct a set of virtual magnetic resonance channels. Execution of the machine-executable instructions further cause the processor to transmit the set of weighting factors to the magnetic resonance imaging receive antenna using the digital communication channel. The magnetic resonance imaging receive antenna is configured for setting the set of calculated weighting factors as the set of weighting factors upon receipt via the digital communication channel. The advantages of this embodiment have been previously discussed.

In another aspect the invention provides for a method of operating a medical instrument. The medical instrument comprises a magnetic resonance imaging receive antenna. The magnetic resonance imaging receive antenna comprises multiple antenna elements each configured for receiving a magnetic resonance imaging radio-frequency signal. The magnetic resonance imaging receive antenna further comprises a radio-frequency receiver connected to each of the multiple antenna elements. The radio-frequency receiver is configured to receive the magnetic resonance imaging radio-frequency signal and to convert the radio-frequency signal to digital magnetic resonance data. The magnetic resonance imaging receive antenna further comprises a digital combiner. The digital combiner is configured to combine a weighted combination of the digital magnetic resonance data for each of the radio-frequency signal into a chosen number of digital virtual magnetic resonance channels using a set of weighting factors.

The magnetic resonance imaging receive antenna further comprises a first digital communication transceiver configured for transmitting the digital virtual magnetic resonance channels via digital communication channel. The digital communication channel is a serial communication channel. The medical instrument further comprises a magnetic resonance imaging system configured for acquiring magnetic resonance data from an imaging zone. The magnetic resonance imaging system comprises a second intermediate digital communication transceiver configured for forming the digital communication channel with the first digital communication transceiver. The magnetic resonance imaging system is further configured for receiving the digital virtual magnetic resonance channels via the digital communication channel.

The method comprises controlling the magnetic resonance imaging system to measure coil sensitivity data for each of the multiple antenna elements by controlling the magnetic resonance imaging system with the coil sensitivity pulse sequence commands. The coil sensitivity data is received via the digital communication channel.

The method further comprises determining a coil sensitivity profile for each of the multiple antenna elements using the coil sensitivity data. The method further comprises receiving a chosen field of view, a chosen pulse sequence for controlling the magnetic resonance imaging system to acquire the digital magnetic resonance data, and an available bandwidth limit. The method further comprises determining the chosen number of digital virtual magnetic resonance channels using the chosen field of view, the chosen pulse sequence, and the available bandwidth limit.

The method further comprises determining a set of calculated weighting factors using the chosen number of digital virtual magnetic resonance channels and the coil sensitivity profile for each of the multiple antenna elements to construct a set of virtual magnetic resonance channels. The method further comprises transmitting the set of calculated weighting factors to the magnetic resonance imaging receive antenna using the digital communication channel. The magnetic resonance imaging receive antenna is configured for setting the set of calculated weighting factors as the set of weighting factors upon receipt via the digital communication channel. The advantages of this embodiment have been previously discussed.

It is understood that one or more of the aforementioned embodiments of the invention may be combined as long as the combined embodiments are not mutually exclusive.

As will be appreciated by one skilled in the art, aspects of the present invention may be embodied as an apparatus, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example, a data may be retrieved over a modem, over the internet, or over a local area network. Computer executable code embodied on a computer readable medium may be transmitted using any appropriate medium, including but not limited to wireless, wire line, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances, the computer executable code may be in the form of a high-level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It is understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

Magnetic Resonance (MR) data is defined herein as being the recorded measurements of radio frequency signals emitted by atomic spins using the antenna of a Magnetic resonance apparatus during a magnetic resonance imaging scan. Magnetic resonance data is an example of medical image data. Digital magnetic resonance data is Magnetic Resonance data that has been converted into a digital format. A Magnetic Resonance Imaging (MM) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
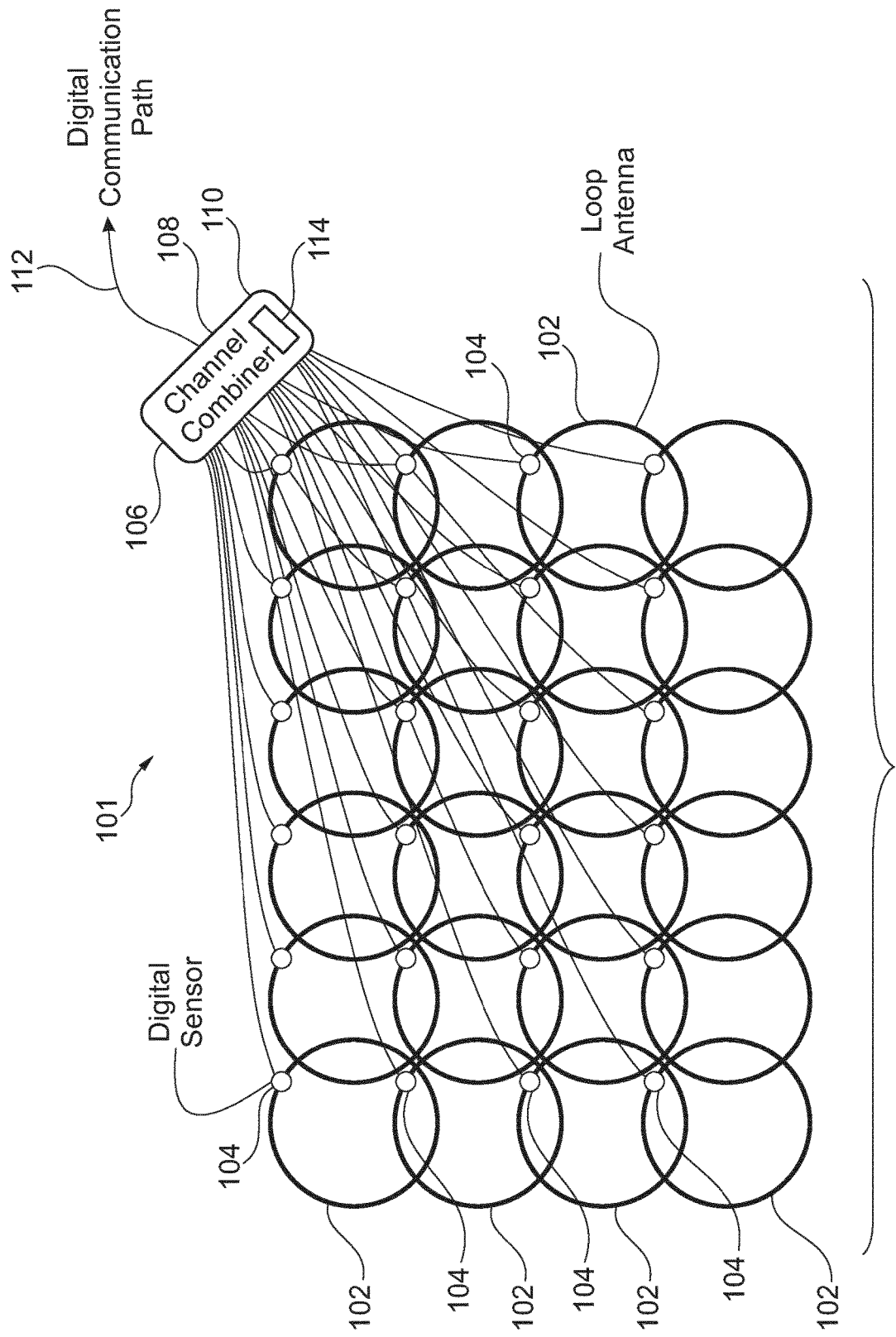
FIG. 1 illustrates an example of a medical instrument.

FIG. 1 illustrates an example of a medical instrument 100 with a magnetic resonance imaging receive antenna 101. The magnetic resonance imaging receive antenna 110 is a surface antenna or surface coil. It is made up of a large number of antenna elements 102. Each antenna element 102 comprises a radio-frequency receiver 104. In FIG. 1 the antenna elements 102 are also labeled loop antennas. The radio-frequency receiver 104 is also labeled as a digital sensor. Not all of the antenna elements 102 or the radio-frequency receivers 104 are numbered in this Figure. There is a digital connection between each radio-frequency receiver 104 and an electronics package 106. The electronics package 106 comprises a digital combiner 108 and a first digital communications transceiver 110. The first digital communications transceiver 110 is used to form a digital communication channel 112. The electronics package 106 is also shown as optionally comprising a battery 114. The magnetic resonance imaging receive antenna 110 is typically placed on a subject within a magnetic resonance imaging system. The digital communication channel 112 could for example be provided by a fiber optic cable that then takes digital magnetic resonance data to the magnetic resonance imaging system. Details of how the digital combiner 108 and the first digital communications transceiver 110 are explained in the context of FIGS. 6-11.

In FIG. 1 each of the antenna element 102 is configured for receiving a magnetic resonance imaging radio-frequency signal. The radio-frequency receiver 104 that is connected to each antenna element 102 is configured to receive the magnetic resonance imaging radio-frequency signal and to convert the magnetic resonance imaging radio-frequency signal to digital magnetic resonance data.

The digital combiner 108 is configured to combine a weighted combination of the digital magnetic resonance data from each of the radio-frequency signal into a chosen number of digital virtual magnetic resonance channels using a set of weighting factors. The first digital communications transceiver 110 is then configured for transmitting the digital virtual magnetic resonance channels via the digital communication channel 112. The digital communication channel could for example be a serial communication channel, a combination of multiple serial communication channels, and/or other communication channels.

Figure 2:
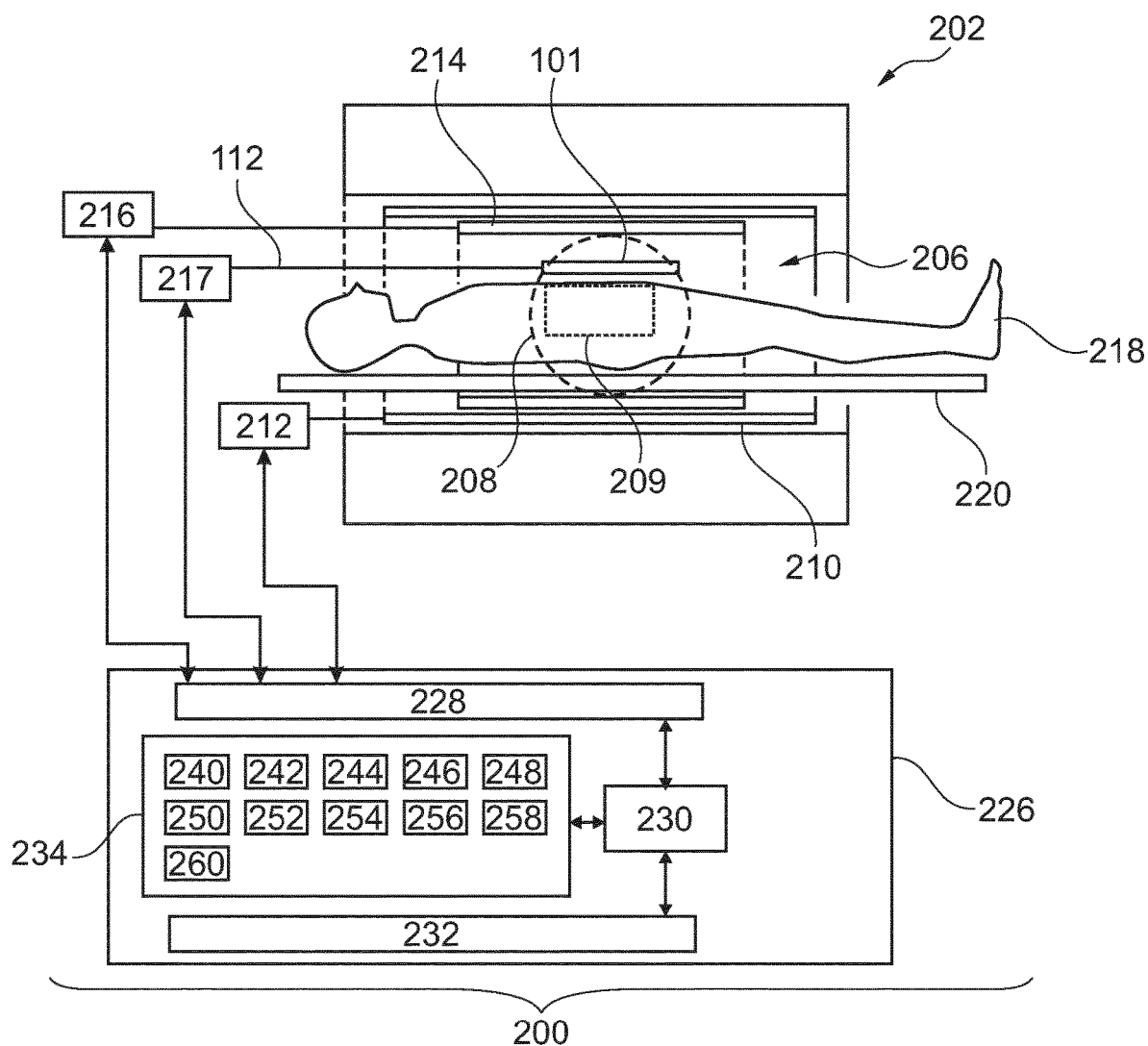
FIG. 2 illustrates a further example of a medical instrument.

FIG. 2 illustrates an example of a medical instrument 200. The medical instrument 200 is similar to the medical instrument 100 in FIG. 1 except that the medical instrument 200 further comprises a magnetic resonance imaging system 202.

The magnetic resonance imaging system 202 comprises a magnet 204. The magnet 204 is a cylindrical type magnet with a bore 206 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils. Within the bore 206 of the cylindrical magnet 204 there is an imaging zone2 where the magnetic field is strong and uniform enough to perform magnetic resonance imaging. A field of view 209 is shown within the imaging zone 208. A subject 218 is shown as being supported by a subject support 220 such that at least a portion of the subject 218 is within the imaging zone 208 and the field of view 209.

Within the bore 206 of the magnet there is also a set of magnetic field gradient coils 210 which is used for acquisition of magnetic resonance data to spatially encode magnetic spins within the imaging zone 208 of the magnet 204. The magnetic field gradient coils 210 connected to a magnetic field gradient coil power supply 212. The magnetic field gradient coils 210 are intended to be representative. Typically magnetic field gradient coils 210 contain three separate sets of coils for spatially encoding in three orthogonal spatial directions. A magnetic field gradient power supply supplies current to the magnetic field gradient coils. The current supplied to the magnetic field gradient coils 210 is controlled as a function of time and may be ramped or pulsed.

Within the bore of the magnet 206 is a body coil 214 for manipulating the orientations of magnetic spins within the imaging zone 208. The body coil 214 is connected to a radio-frequency transmitter 216. Also, within the bore of the magnet is the magnetic resonance imaging receive antenna 101. The magnetic resonance imaging system 202 is further shown as comprising a second intermediate digital communications transceiver 217. The second intermediate digital communications transceiver 217 and the first digital communications transceiver 210 form a digital communication channel 112. In this example the digital telecommunication channel 112 is a physical connection. This may for example be a fiber optic connection.

The transmitter 216, the gradient controller 212, and the second intermediate digital communication transceiver are shown as being connected to a hardware interface 228 of a computer system 226. The computer system further comprises a processor 230 that is in communication with the hardware system 228, a memory 234, and a user interface 232. The memory 234 may be any combination of memory which is accessible to the processor 230. This may include such things as main memory, cached memory, and also non-volatile memory such as flash RAM, hard drives, or other storage devices. In some examples the memory 230 may be considered to be a non-transitory computer-readable medium.

The memory 234 is shown as containing machine-executable instructions 240. The machine-executable instructions 240 enable the processor 230 to control the magnetic resonance imaging system 202 via the hardware interface 228. The machine-executable instructions 240 may also enable the processor 230 to perform various data processing and image processing functions.

The memory 234 is further shown as containing coil sensitivity pulse sequence commands 242. The coil sensitivity pulse sequence commands 242 is used to control the magnetic resonance imaging system 202 to acquire coil sensitivity data 244 from each of the antenna elements 102. The memory 234 is shown as containing coil sensitivity data 244 that was acquired using the coil sensitivity pulse sequence commands 242. The memory 234 is further shown as containing a coil sensitivity profile 246 that was calculated using the coil sensitivity data 244.

The memory 234 is shown as containing a selection of a chosen field of view 248, chosen pulse sequence commands 250, and an available bandwidth limit 252. These quantities are then used to calculate a chosen number of digital virtual magnetic resonance channels 254. The chosen number 254 is stored in the memory 234. The memory 234 is further shown as containing a set of calculated weighting factors 256. The set of calculated weighting factors 256 can be uploaded into the magnetic resonance imaging receive antenna 100. They then replace the set of weighting factors that is used by the digital combiner 108.

The memory 234 is shown as optionally containing magnetic resonance data 258 that has been acquired by controlling the magnetic resonance imaging system 202 with the chosen pulse sequence commands 250. The magnetic resonance data 258 was acquired after the set of calculated weighting factors 256 was uploaded to the magnetic resonance imaging receive antenna 100.

The memory 234 is further shown as containing a magnetic resonance image 260 that was reconstructed from the magnetic resonance data 258. In the example shown in FIG. 2 the magnetic resonance data 258 is only collected by the magnetic resonance imaging receive antenna 100. In this case the magnetic resonance data 258 is data that has been received from the first digital communication transceiver 110.

Figure 3:
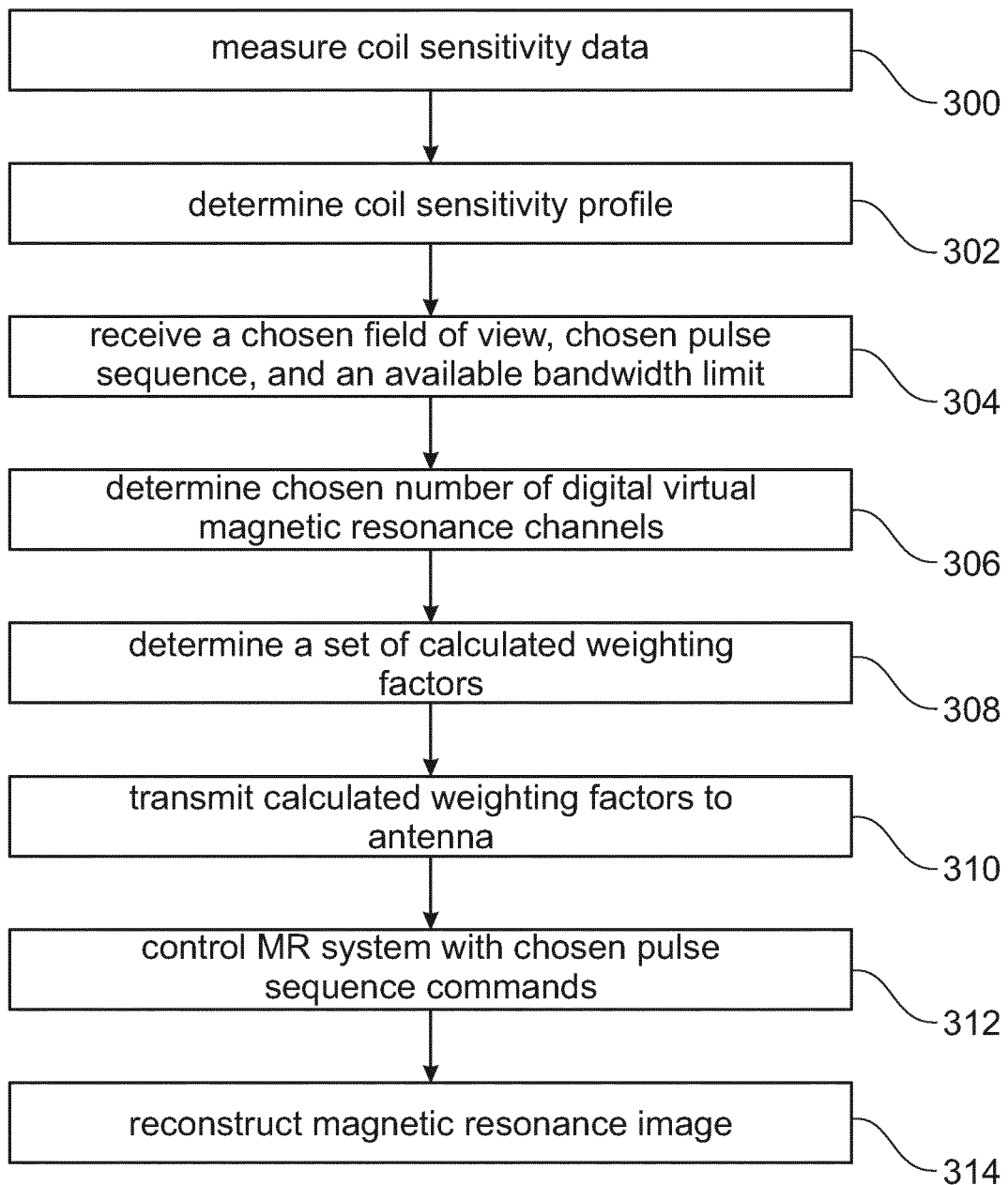
FIG. 3 shows a flow chart which illustrates a method of operating the medical instrument of FIG. 2.

FIG. 3 shows a flowchart which illustrates a method of operating the medical instrument 200 of FIG. 2. First in step 300 the magnetic resonance imaging system 202 is controlled with the coil sensitivity pulse sequence commands 242 to acquire the coil sensitivity data 244. The coil sensitivity data 244 is received via the digital communication channel 112. Next in step 302 the coil sensitivity profile 246 is determined for each of the multiple antenna elements 102 using the coil sensitivity data 244. Then in step 304 the chosen field of view 248, the chosen pulse sequence commands 250, and the available bandwidth limit 252 are received.

Then in step 306 the chosen number of digital virtual magnetic resonance channels 254 is determined by using the chosen field of view 248, the chosen pulse sequence commands 250, and the available bandwidth limit 252. Next in step 308 the set of calculated weighting factors 256 is determined using the chosen number of digital virtual magnetic resonance channels 254 and the coil sensitivity profile 246 for each of the multiple antenna elements 102. This is performed to construct a set of virtual magnetic resonance channels. Next in step 310 the set of calculated weighting factors 256 is transmitted to the magnetic resonance imaging receive antenna 100 using the digital communication channel 112. The magnetic resonance imaging receive antenna 100 is configured for setting the set of calculated weighting factors 256 as the set of weighting factors upon receipt via the digital communication channel 112.

Figure 4:
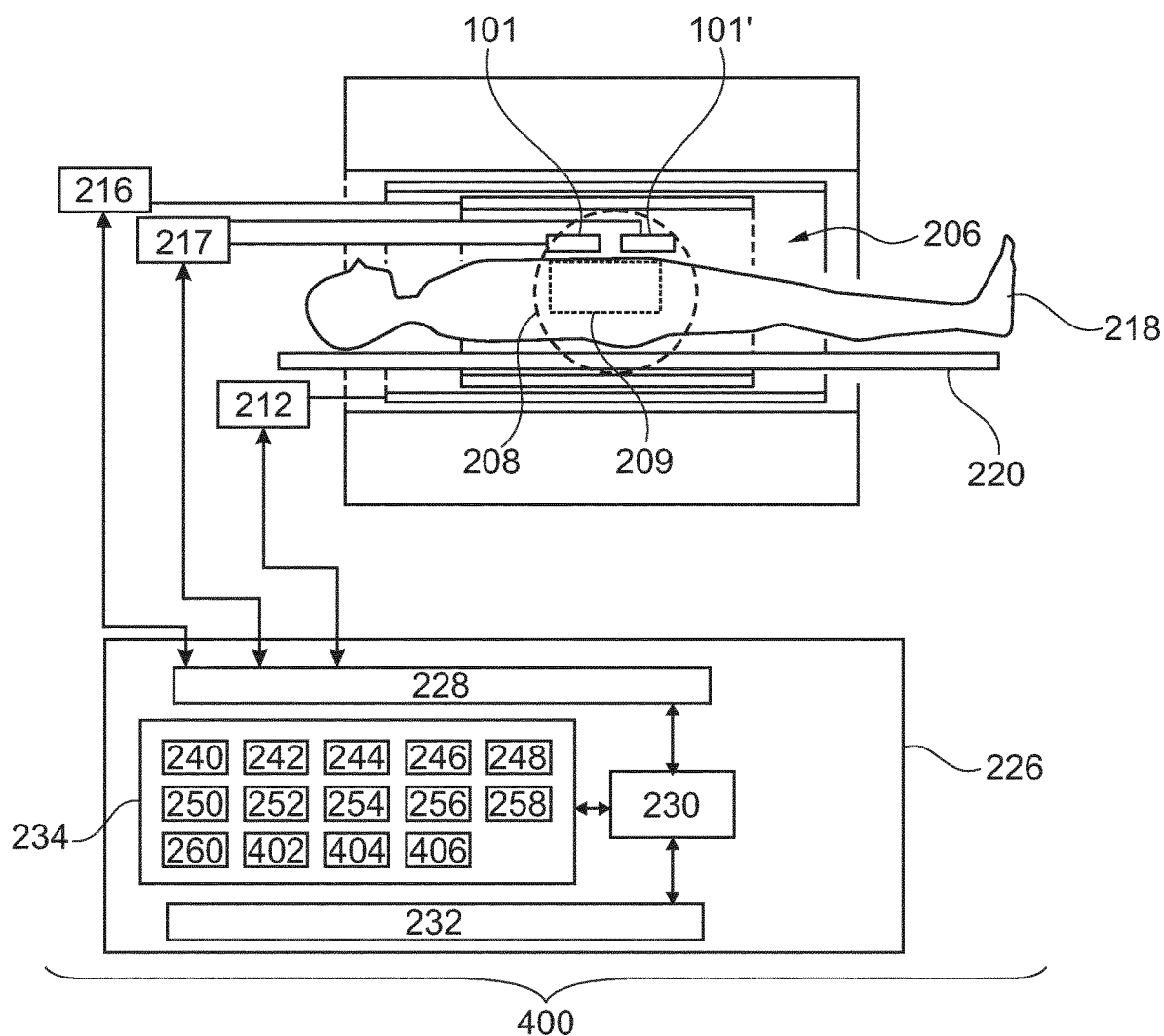
FIG. 4 illustrates a further example of a medical instrument.

FIG. 4 shows a further example of a medical instrument 400. The medical instrument 400 depicted in FIG. 4 is similar to the medical instrument 200 depicted in FIG. 2. In this case instead of a single magnetic resonance imaging receive antenna 100 there is a magnetic resonance imaging receive antenna 101 and an additional magnetic resonance imaging receive antenna 101'. Both of them have a digital telecommunication channel 112 that is formed with the second intermediate digital communications transceiver 217. In this case the available bandwidth limit 252 may be reduced so that both antennas 101, 101' may be accommodated.

Additionally, the memory 234 is shown as containing channel noise pulse sequence commands 402. The channel noise pulse sequence commands 402 may be used to acquire channel noise data 404 for each of the antenna elements 102. The channel noise data 404 is shown as being stored in the memory 234. The channel noise data 404 may be used to calculate noise decorrelation coefficients 406. It should be noted that the set of calculated weighting factors 256 and the noise decorrelation coefficients 406 may be calculated for each of the antenna elements 102 of each of the antennas 101, 101' separately. Noise decorrelation coefficients 406 may be calculated between antenna elements 102 within a single antenna 101 or 101'. Since the digital combiner 108 has access to the channels (antenna elements 102) within the antenna 101 or 101' in which it resides, it can only combine those channels and can only decorrelate noise between those channels. It is possible to perform noise decorrelation between the antenna elements 102 between multiple antennas 101, 101' however this decorrelation would be performed by the processor 230.

Figure 5:
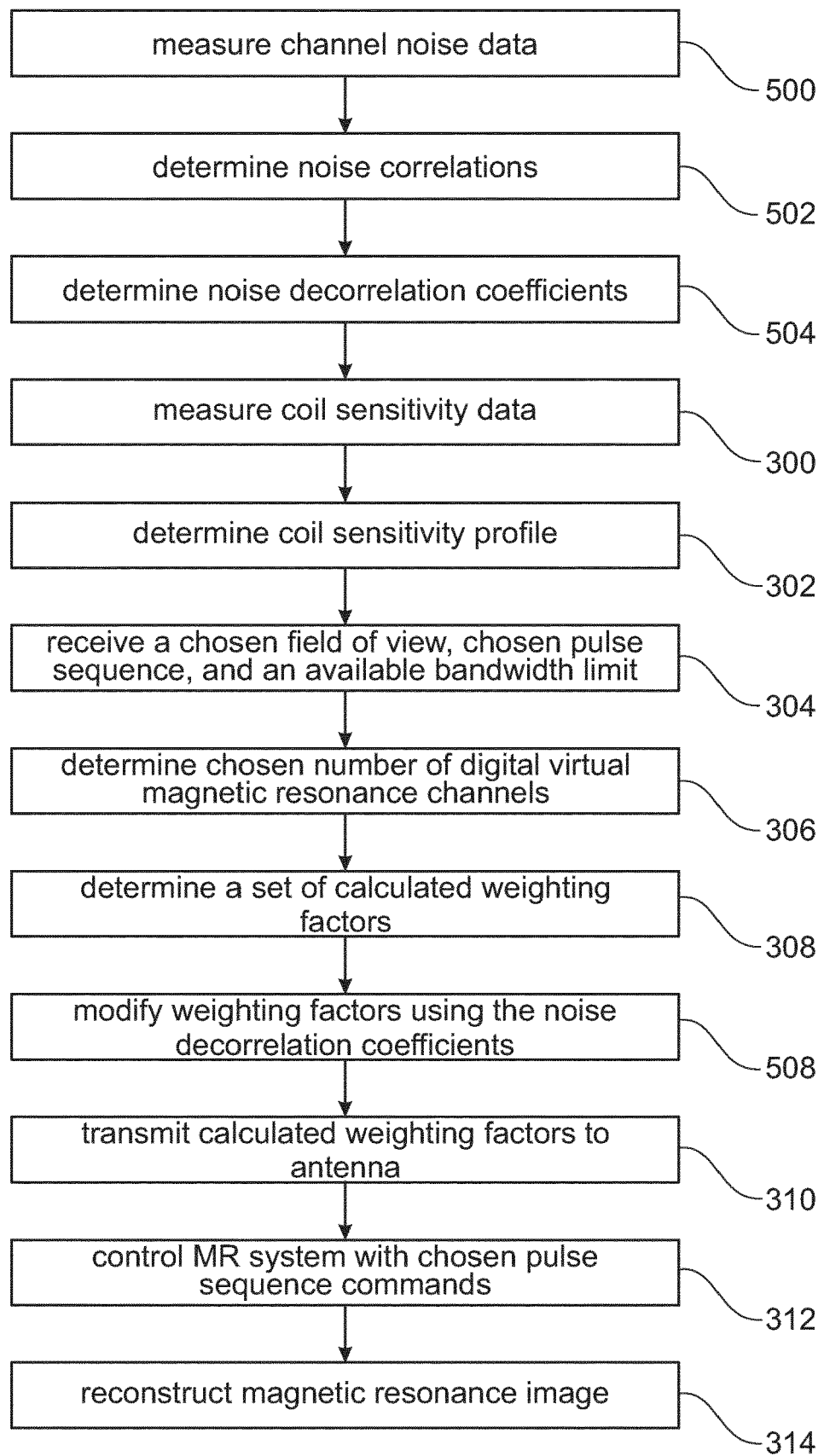
FIG. 5 shows a flow chart which illustrates a method of operating the medical instrument of FIG. 4.

FIG. 5 shows a method of operating the medical instrument 400 of FIG. 4. First in step 500 the magnetic resonance imaging system 200 is controlled with the channel noise pulse sequence commands 402 to acquire the channel noise data 404. Next in step 502 the channel noise data 404 is used to calculate the noise correlations 408. Then in step 504 the noise decorrelation coefficients 406 are determined for each of the digital magnetic resonance channels using the noise correlations 408. The method then proceeds to steps 300, 302, 304, and 306 as was illustrated in FIG. 3. After step 306 step 308 is performed.

After step 308, step 508 is performed. In step 508 the noise decorrelation coefficients 406 are used to modify the weighting factors. After step 508 the method then proceeds to steps 310, 313, and 314 as is illustrated in FIG. 3.

The number of channels in magnetic resonance imaging receive coils 101, such as MRI surface coils, has been increasing steadily. Increased channel count is advantageous for both (spatial) signal-to-noise (SNR) and parallel imaging (SENSE) performance. Digital MM surface coils transport acquired digitized RF signals over a digital network for further processing to form images. The amount of acquired digital data increases as the channel count of surface coils increases.

A practical problem associated with increasing channel count is that it requires an increasingly large number of coaxial cables and large number of connector points to transfer to the RF signals from the RF coil to the system for digitization and further digital signal processing. The large number of coaxial cables pose physical problems (increased weight and cable diameter, increased losses when decreasing coax diameter, increased RF traps weight and volume . . . ). The larger number of connector points also pose physical problems (increased connector insertion force, increase connector size and weight, reduced reliability . . . ). Systems that digitize the signal in the RF coil, on the other hand, must cope with a limited digital network bandwidth.

High channel count analogue coil designs typically allow the combination of two or more channels to effectively reduce the channel count and thereby reduce the number of RF signals to be transported and processed. Alternatively, high channel count analogue coils commonly transport RF signals from multiple channels over a single coaxial cable at different carrier frequencies effectively to reduce the number of coaxial cables. As the channel count increases, additional measures are taken at the surface coil to reduce the amount of data to be transported and subsequently processed.

For large channel count digital coils 101, the amount of digital data (digital magnetic resonance data 258) can easily exceed the limited bandwidth of the network and/or the limited resources of the computer infrastructure, such as memory and processing capacity, used to process the acquired data. In particular the bandwidth limitation of a wireless network is challenging. It is also well known that the individual channels of high channel count coils do not contribute equally to signal-to-noise (SNR) and/or parallel imaging performance. By combining physical channels to a reduced number of virtual channels (digital virtual magnetic resonance channels 800) through a linear combination (using the set of calculated weighting factors 256), the amount of generated data can be reduced with a limited impact on SNR and/or parallel imaging performance.

The number of virtual channels (chosen number of digital virtual magnetic resonance channels 254) can be chosen to conform to the limited network bandwidth of and/or computer (memory and processing) resources. A fully programmable linear combination enables arbitrary optimization strategies to be applied. In particular, it enables channel combinations that optimize SNR and acceleration as function of the scan protocol (pulse sequence) and specific imaging volume (anatomy) under the constraint of limited digital network bandwidth. This contrasts with the analogue designs that can only combine predetermined channels and thus lack the ability to optimize SNR and acceleration capabilities as function of anatomy and/or scan protocol.

This capability also enables high channel count coils to be deployed on existing system with limited network bandwidth, obviating the need to upgrade the system to a higher network bandwidth. This has definite commercial advantages as it increases the number of systems in the installed base for which such coils can be deployed.

The ability to optimize the combination of channels takes full advantage of the unique feature of digitizing the RF signal in the surface coil as opposed to digitizing the signal in the system.

A magnetic resonance imaging receive antenna 101, 101' such as a digital surface coil typically consists of a number of physical channels (P) corresponding to antenna elements 102. In each channel, the MR signal is detected with a RF magnetic loop antenna (or element 102) and digitized with a receiver (RX) 104 dedicated to the channel to form a digital signal (digital magnetic resonance data 258). The digital channel signals are subsequently communicated to the system over a digital communication channel 112.

The digital communication channel 112 may be bandwidth limited due to either technology, size, power or cost constraints. For example, a wireless communication channel is severely limited in bandwidth whereas an optical link has a much higher bandwidth. The bandwidth limitation may be a function of the system on which the surface coil is used and/or of the communication channel interface of the surface coil. As the number of channels in the digital surface coil increases, the bandwidth of the communication channel becomes a limiting factor.

Increasing the channel count of a surface coil increases its spatial sensitivity and consequently influences spatial signal to noise behavior in resulting images and/or its ability to perform parallel imaging. It is also known that for high channel count coils not all channels contribute equally to parallel imaging performance or signal to noise when imaging a particular field of view. This can be exploited by combining the signals of selected channels prior to transferring the data over the communication channel thereby reducing the aggregate signal bandwidth without significantly impairing signal to noise or parallel imaging performance.

The P physical channels can be combined into V virtual channels for subsequent limited bandwidth transfer and processing. For maximum flexibility, the channel combiner performs a weighted combination of all P physical channel for each virtual channel. The weights required for this combination is stored in a V by P element channel combination matrix.

Figure 6:
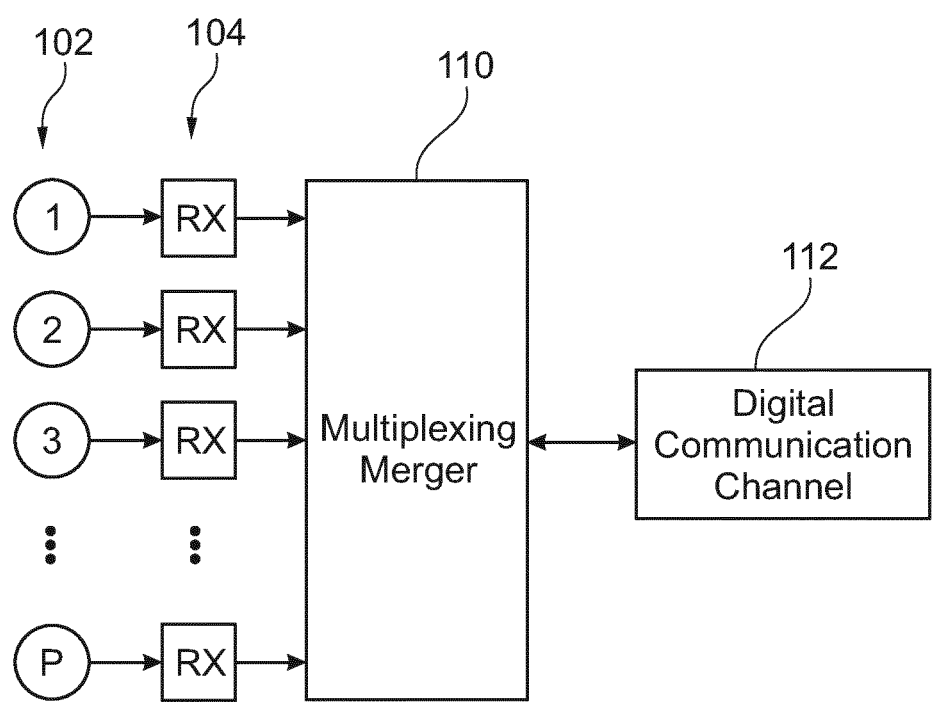
FIG. 6 shows a functional diagram of a magnetic resonance imaging receive antenna.

FIG. 6 illustrates an example of a typical digital receive coil 600. In FIG. 6 the receive coil comprises a number of antenna elements 102 each connected to a receiver 104. The receivers 104 output digital data and are connected to the first digital communications transceiver 110. In this example the transceiver 110 also comprises a multiplexing merger. The transceiver is then used to connect to the digital communication channel 112. In the example in FIG. 6 all of the data from each of the antenna elements 102 is transmitted using the first digital communications transceiver 110.

Figure 7:
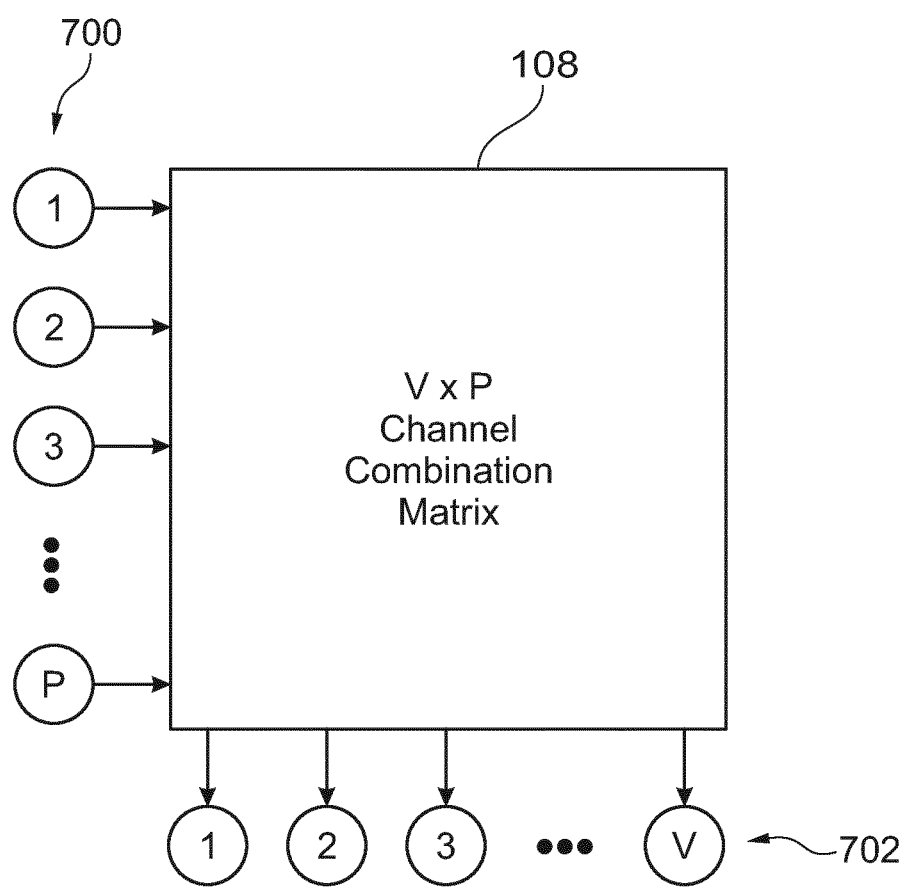
FIG. 7 illustrates an example of a V×P channel combination matrix

FIG. 7 illustrates an example of a digital combiner 108. In this example it is a V by P channel combination matrix. There are P inputs 700 and V outputs 702. The digital combiner 108 can be used to modify the receive coil 600 illustrated in FIG. 6.

The combination of channels by the combiner 109 can be represented as a matrix multiplication on the physical channel vector to form a virtual channel vector.

$$\begin{bmatrix} v1 \\ v2 \\ \vdots \\ vV \end{bmatrix} = \begin{bmatrix} c11 & c12 & \ldots & c1P \\ c21 & c22 & \ldots & c2P \\ \vdots & \vdots & \ddots & \vdots \\ cV1 & cV2 & \ldots & cVP \end{bmatrix} \times \begin{bmatrix} p1 \\ p2 \\ \vdots \\ pP \end{bmatrix}$$

This operation is performed on successive samples generated by the channel receivers.

Figure 8:
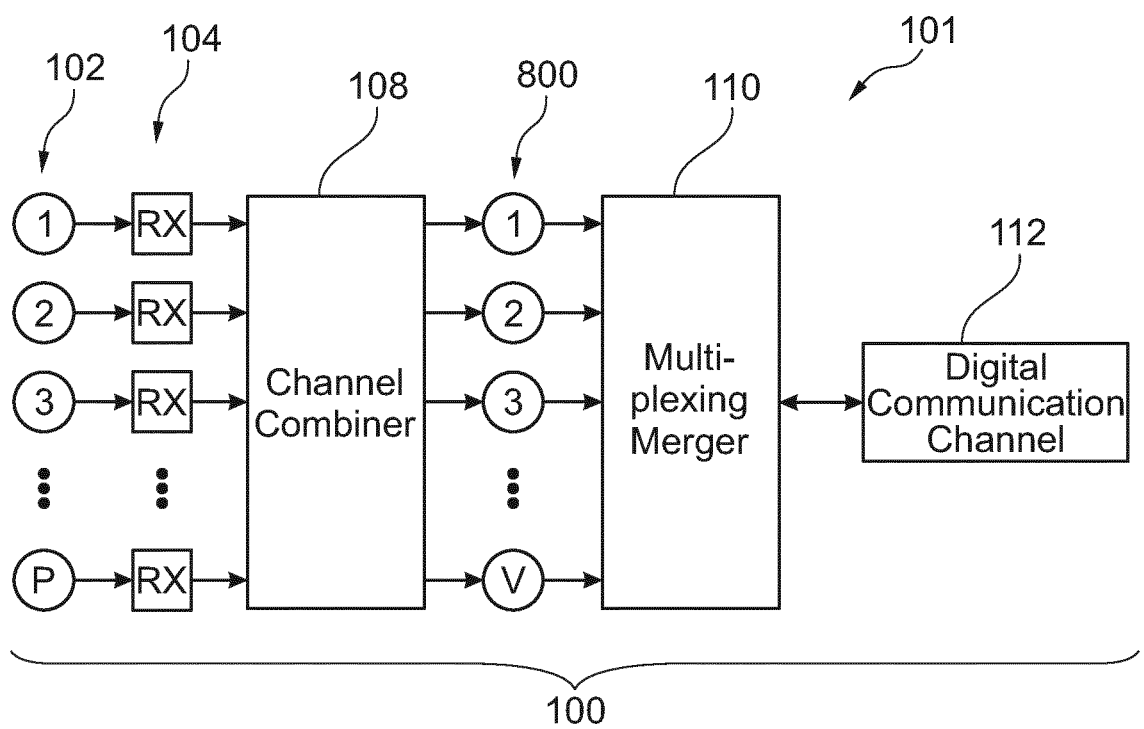
FIG. 8 illustrates an example of a magnetic resonance imaging receive antenna with digital virtual magnetic resonance channels.

The resulting virtual surface coil topology is illustrated in FIG. 8 below.

FIG. 8 illustrates this modification and is equivalent to the magnetic resonance imaging receive antenna 101 illustrated in FIG. 1. There are the multiple antenna elements 102 that are connected to the radio-frequency receiver 104. The output of each of the radio-frequency receiver 104 is connected to an input of the digital combiner 108. The digital combiner 108 then outputs the digital virtual magnetic resonance channels 800. The output of the digital combiner 108 is input into the first digital communications transceiver 110. For each virtual channel j, P multipliers and a P-way adder are used.

Figure 9:
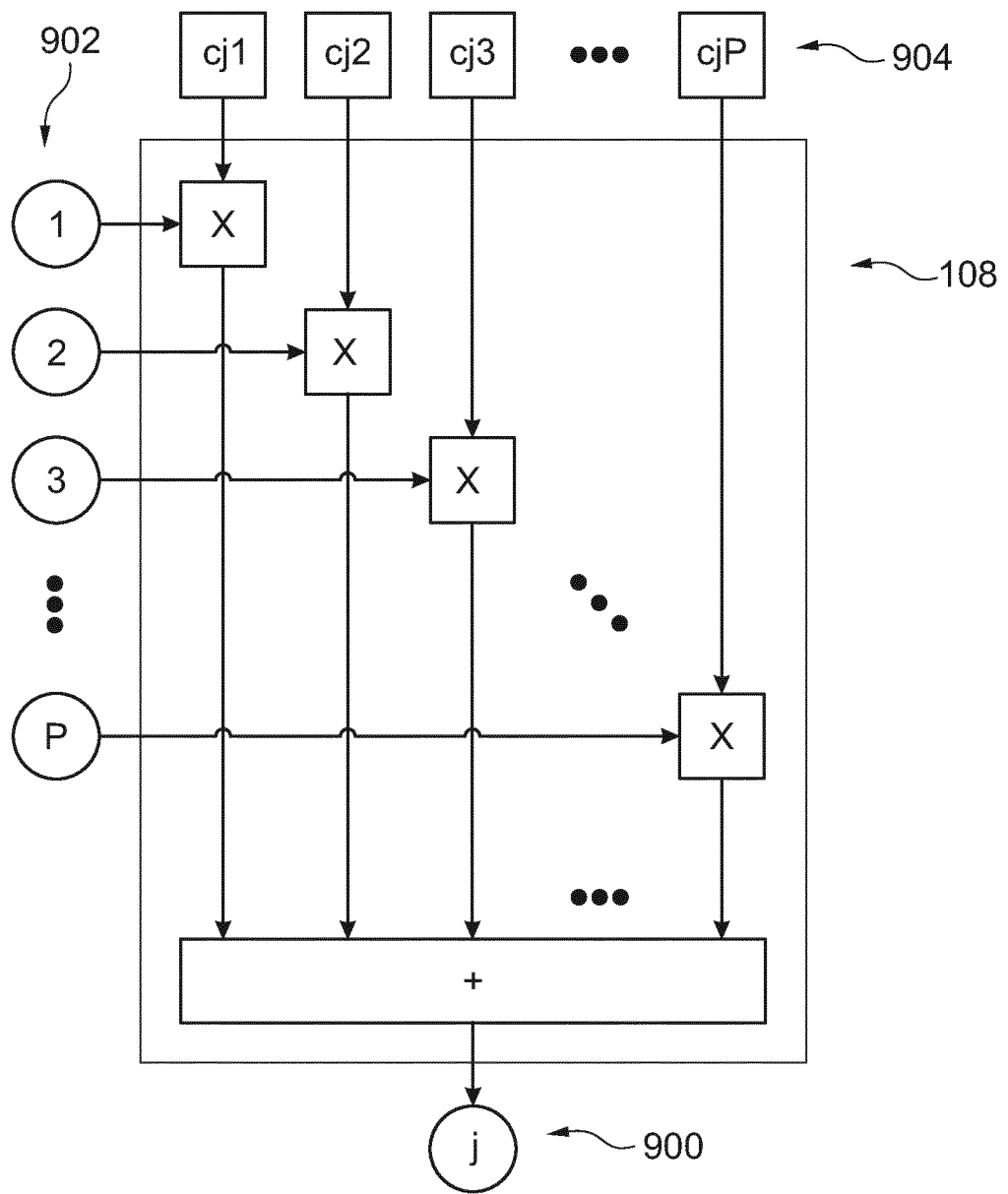
FIG. 9 illustrates an implementation of a single digital virtual magnetic resonance channel.

FIG. 9 illustrates a portion of the digital combiner 108 for calculating a single virtual magnetic resonance channel 900. The digital magnetic resonance data 902 is input and then the set of weighting factors 904 is used to control how these are summed together to form the single virtual magnetic resonance channel 900.

To limit hardware resources, a maximum N (less than P) can be placed on the number of channels that can be combined to form a single virtual channel. This provides a tradeoff between the performance of the channel combination and the hardware resources required for the channel combiner.

Figure 10:
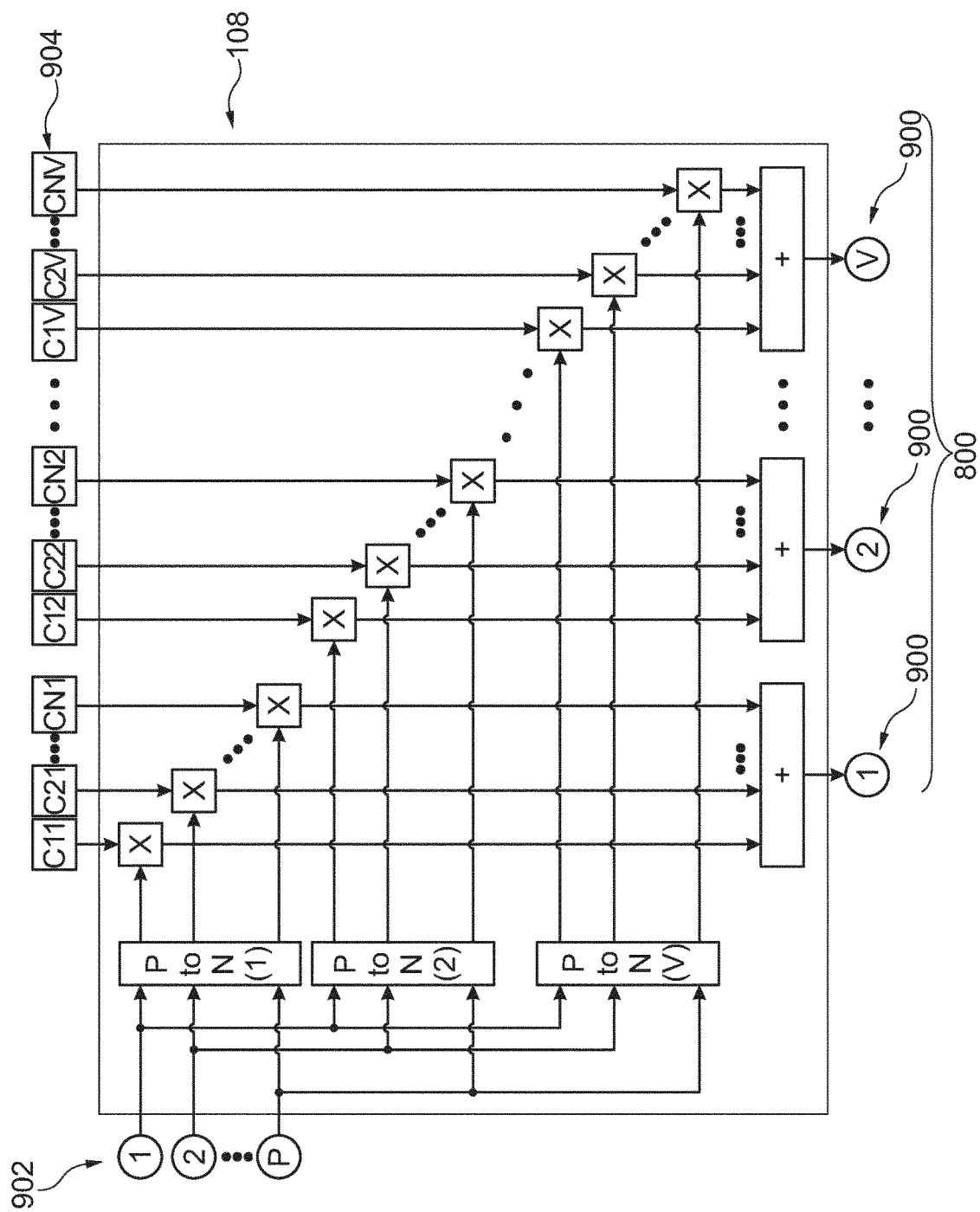
FIG. 10 illustrates a channel combiner that implements multiple digital magnetic resonance channels.

FIG. 10 illustrates the entire digital combiner 108 using this concept. Again, the digital magnetic resonance data 902 is input and the set of weight factors 904 are used to control how these are combined into the different individual virtual magnetic resonance channels 900. All of these virtual magnetic resonance channels 900 form the virtual magnetic resonance channels 800 that are then transmitted by the first digital communications transceiver 110. This reduces the number of multipliers from P×V to N×V and reduces each adder from a P way adder to an N way adder but adds V P to N multiplexers to select the N physical channels required for each virtual channel.

Such hardware is readily implemented in an FPGA. When implemented in an FPGA, such hardware can also be performed on shared resources. For the relatively low sample rates at baseband, the computation of individual virtual channels can be time multiplexed. For example, at a baseband sample rate of 1 MHz and an FPGA operating at a modest 100 MHz, 100 virtual channels can be computed with only P multipliers and a single P way adder. This drastically reduces the hardware resources required for channel combination.

Figure 11:
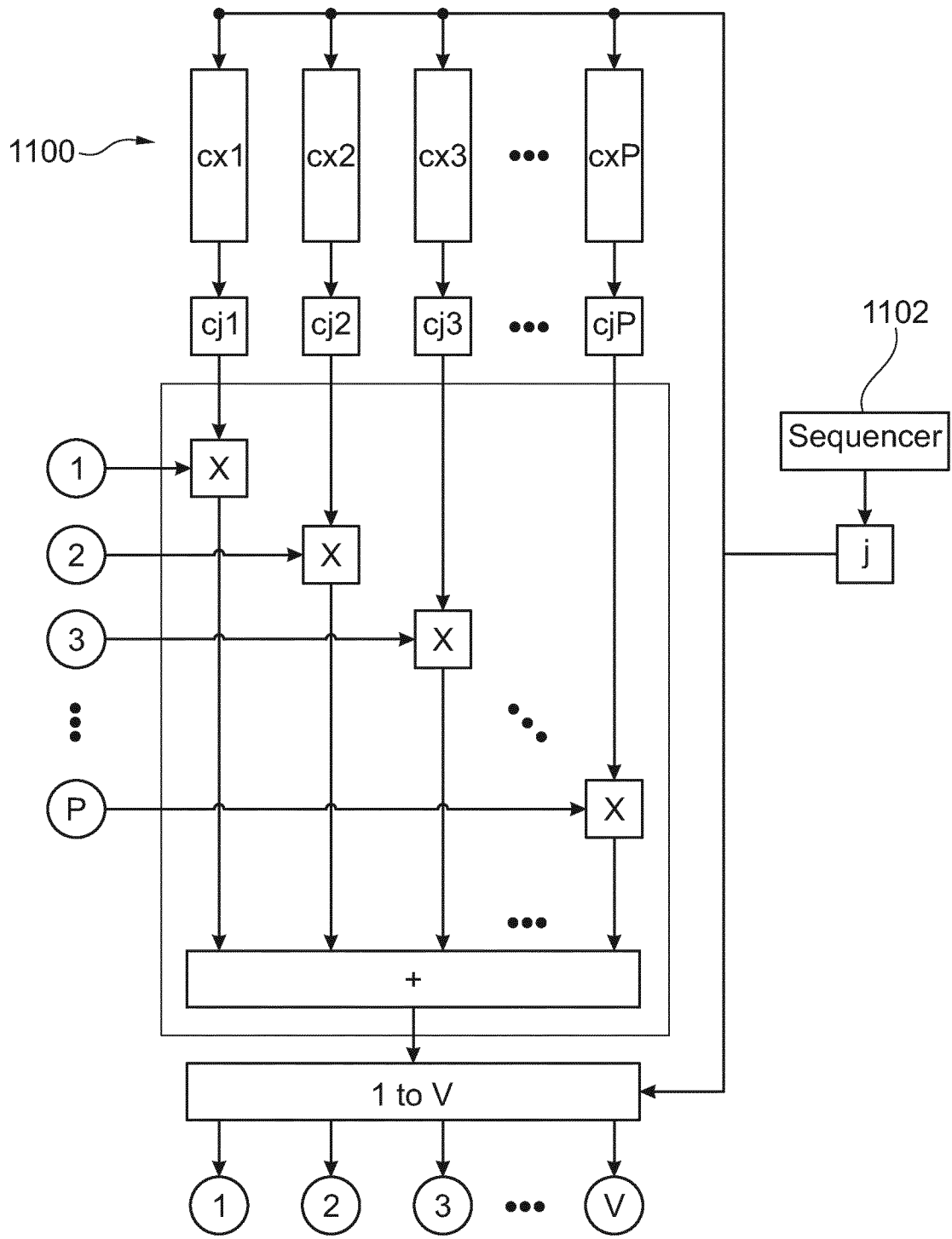
FIG. 11 illustrates a multiphase implementation of the channel combiner that implements multiple digital magnetic resonance channels.

This results in a multiphase implementation of the combiner as is illustrated in FIG. 11. FIG. 11 illustrates a modification of the system illustrated in FIG. 9. The data can all be down converted to a lower frequency and then instead of having dedicated channels a multiplexer 1100 can be used to use a single channel that is then output to a sequencer 1102. The sequencer 1102 would then be connected to the first digital communications transceiver 110.

The P columns of the combination matrix are stored in P memories each containing V coefficient values. The memories are addressed by a sequencer to deliver the coefficients required to compute successive virtual channels combinations. A 1 to V demultiplexer similarly addressed by the sequencer delivers the result to the appropriate virtual channel.

The actual channel combination matrix not only performs the channel combination but can also be used to perform noise decorrelation. Noise decorrelation, as channel combination, can be represented as a matrix operation transforming the P physical channels to P noise decorrelated channels. This is a matrix multiplication of a P element vector with a P by P matrix of noise decorrelation coefficients.

$$\begin{bmatrix} d1 \\ d2 \\ \vdots \\ dP \end{bmatrix} = \begin{bmatrix} n11 & n12 & \ldots & n1P \\ n21 & n22 & \ldots & n2P \\ \vdots & \vdots & \ddots & \vdots \\ nP1 & nP2 & \ldots & nPP \end{bmatrix} \times \begin{bmatrix} p1 \\ p2 \\ \vdots \\ pP \end{bmatrix}$$

Combining the two operations we have:

$$\begin{bmatrix} c11 & c12 & \ldots & c1P \\ c21 & c22 & \ldots & c2P \\ \vdots & \vdots & \ddots & \vdots \\ cV1 & cV2 & \ldots & cVP \end{bmatrix} \times \begin{bmatrix} n11 & n12 & \ldots & n1P \\ n21 & n22 & \ldots & n2P \\ \vdots & \vdots & \ddots & \vdots \\ nP1 & nP2 & \ldots & nPP \end{bmatrix} \times \begin{bmatrix} p1 \\ p2 \\ \vdots \\ pP \end{bmatrix}$$

which can consequently be reduced to:

$$\begin{bmatrix} v1 \\ v2 \\ \vdots \\ vV \end{bmatrix} = \begin{bmatrix} nc11 & nc12 & \ldots & nc1P \\ nc21 & nc22 & \ldots & nc2P \\ \vdots & \vdots & \ddots & \vdots \\ ncV1 & ncV2 & \ldots & ncVP \end{bmatrix} \times \begin{bmatrix} p1 \\ p2 \\ \vdots \\ pP \end{bmatrix}$$

where the ncij coefficients represent the combined noise decorrelation and channel combination operations. For the hardware in the virtual surface coil the incorporation of noise decorrelation in the combination matrix has no consequence, it merely alters the programmable complex coefficients.

The actual coil combination coefficients are computed in software with pre scans that determine the spatial sensitivity profiles and noise correlations of the individual channels. This information, together with the geometry of the field of view and the required parallel imaging properties, is used to determine an optimal channel combination that conforms to the bandwidth limitation of the communication channel.
This resulting procedure (without noise decorrelation) is as follows in FIG. 12

Figure 12:
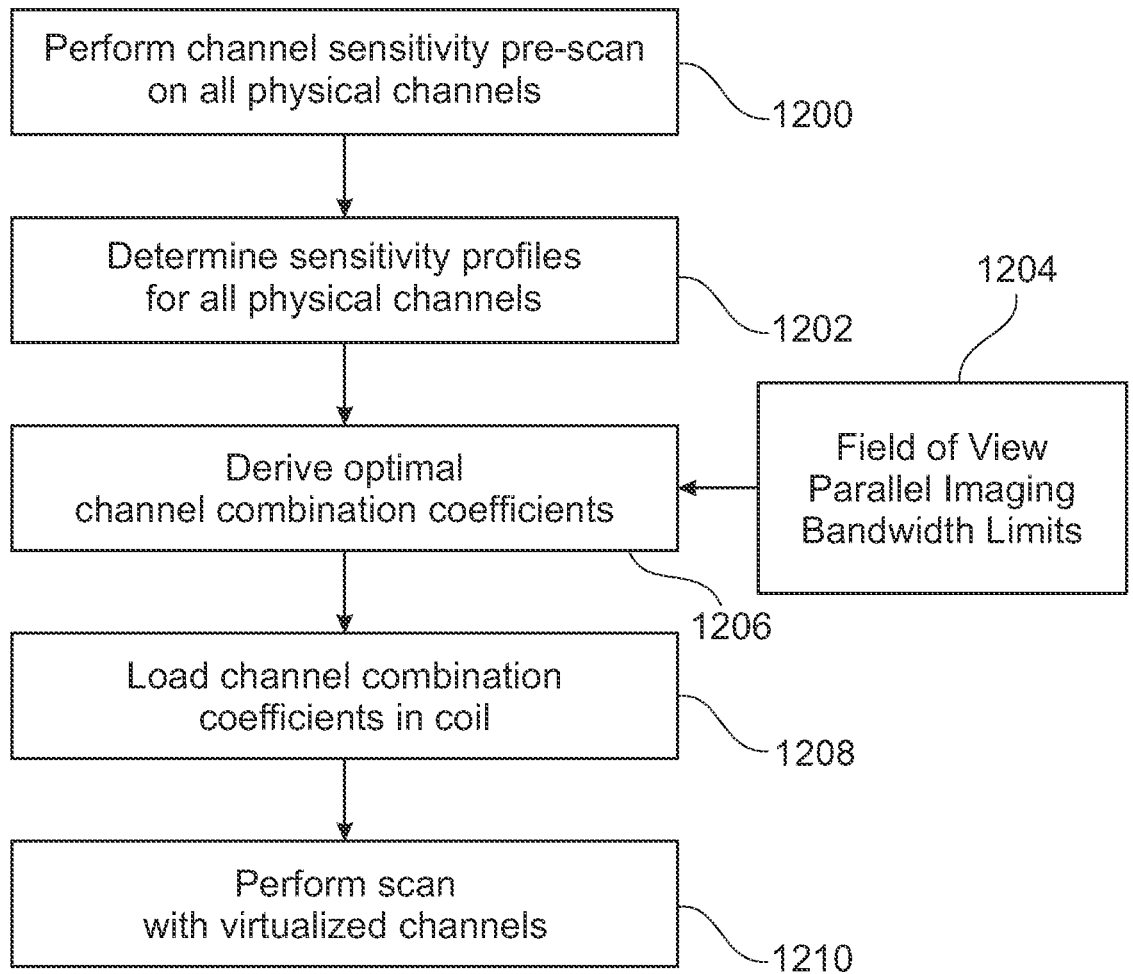
FIG. 12 illustrates an example of a method.

FIG. 12 illustrates an example of a method of operating a medical instrument. First in step 1200 (equivalent to step 300) the pre-scan is performed on all physical channels. Next in step 1202 (equivalent to step 302) the sensitivity profiles for all physical channels are determined. Then in step 1204 the field of view, the parallel imaging and bandwidth limits 1204 are received (equivalent to step 304). Next in step 1206 the channel combination coefficients are derived using an optimization process (equivalent to step 308). Then in step 1208 the channel combination coefficients are loaded into the coil (equivalent to step 310). Then finally in step 1210 the magnetic resonance imaging system is used to perform a scan using the virtualized channels (equivalent to step 312).

Note that steps 1200 and 1202 need not be performed for all scans. The results of a pre-scan are typically reused for a number of subsequent scans, reducing (pre-scan) imaging time. The optimization procedure may additionally take into account (memory and processing) resource limitations of subsequent stages.

Figure 13:
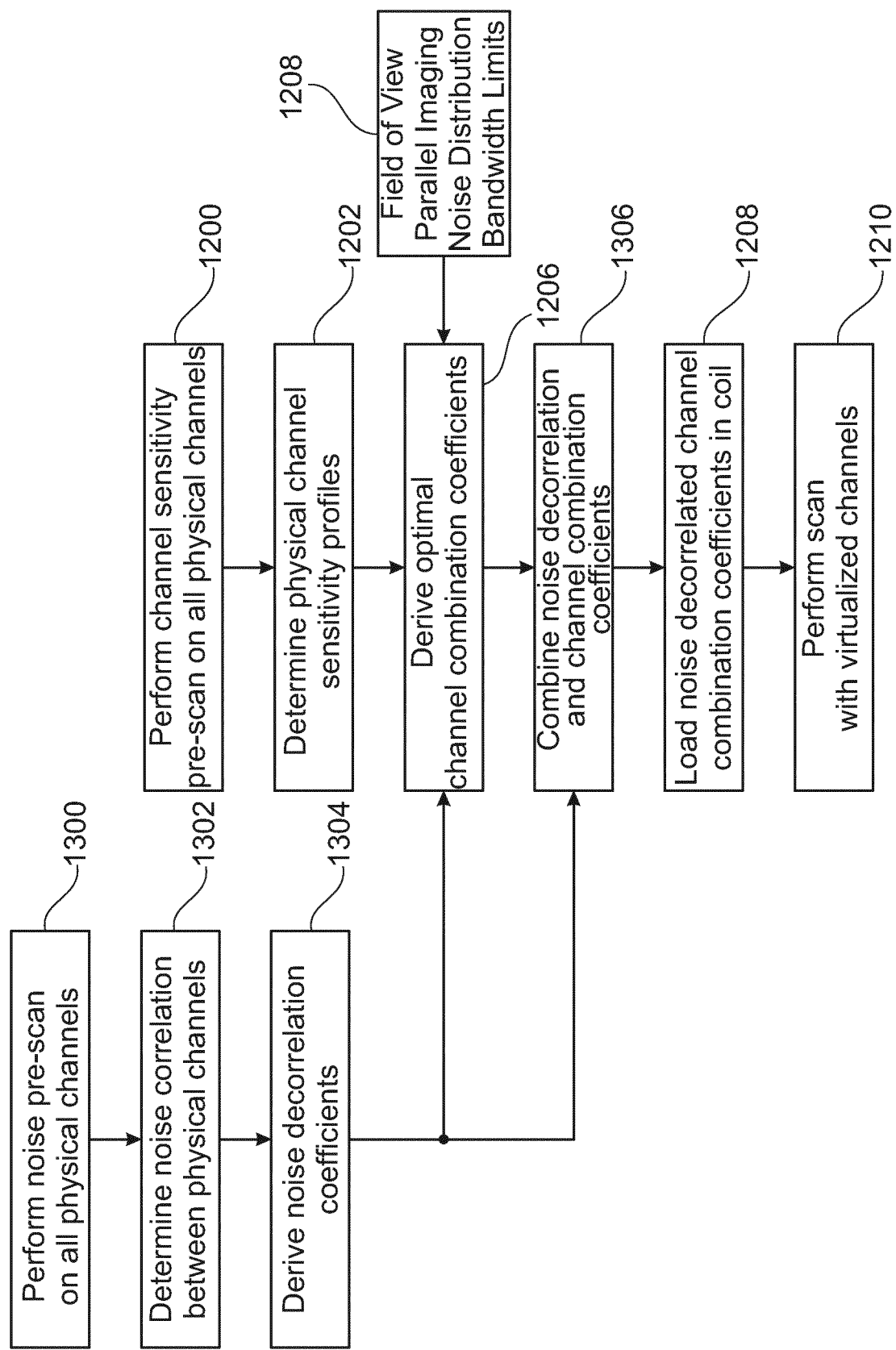
FIG. 13 illustrates a further example of a method.

FIG. 13 illustrates a modification of the method illustrated in FIG. 12 that includes noise decorrelation. In this example in step 1300 a noise pre-scan is performed on all physical channels in step 1300. Next in step 1302 the noise correlation between the different physical channels is determined. Then in step 1304 the noise decorrelation coefficients are derived. The noise decorrelation coefficients 1304 can be used in several different ways. They may be used in step 1206 in the optimization problem to drive the optimal channel combination coefficients. There may also be used optionally in step 1306 where the noise correlation coefficients and the channel combination coefficients are combined. Step 1306 is performed after step 1206. A single factor can be used. After step 1306 steps 1208 and step 1210 are performed as was described in FIG. 12.

The signal to noise and parallel imaging performance may be compromised beyond acceptable image quality limits by extreme bandwidth limitations, such a limitation being either a property of the system or of the surface coil itself. In this case, the optimization procedure may be used to return the maximum attainable signal to noise and parallel imaging performance. This may, for example, result in reporting a maximum parallel imaging acceleration that may be applied for a particular field of view.

For noise decorrelation to perform optimally as a simple weighted combination of physical channels (i.e., with a minimum of hardware requirements), the signals of the individual physical channels may be sampled concurrently. This means that the signal delay path from the channel antenna up to its digitizer as well as the delay paths of the clock signals to the channel digitizers are matched. Alternatively, the digitized signal delays can be characterized with an off line calibration procedure and adjusted prior to the combination operation as a digital operation on the signal by means of a digital delay line. This removes the intractable design challenge associated with matching all analog signal and clock paths in a high channel count design.

Figure 14:
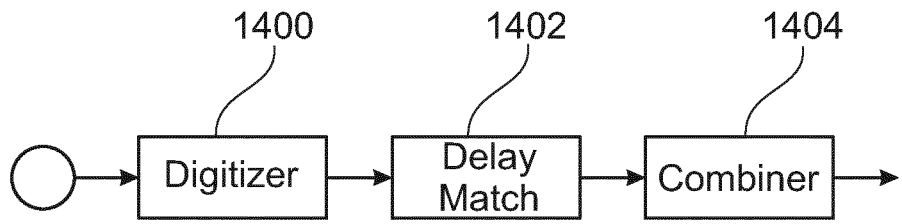
FIG. 14 illustrates a further example of a signal path.

The signal path for each physical channel is then illustrated in FIG. 14. FIG. 14 shows a signal path that comprises a digitizer 1400, a delay match 1402 which is then fed into a combiner 1404.

The signal delay calibration procedure may determine the relative delay mismatch between physical channels. The delay match hardware can then be programmed to resolve the mismatch in channel delays.

Figure 15:
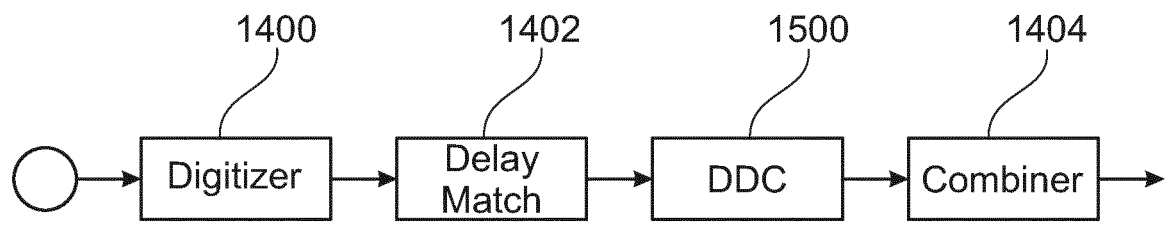
FIG. 15 illustrates a further example of a signal path.

In practice to limit bandwidth, a digitized carrier or intermediate frequency signal is converted to baseband by means of a digital down converter (DDC). Since the coefficients associated with noise decorrelation and channel combination are based on baseband signals, the combiner must consequently operate on baseband signals. The signal path for each physical channel in this case is illustrated in FIG. 15.

The signal path is first through the digitizer 1400 which is then fed into the delay match 1402. The delay match 1402 is fed into the digital down converter 1500. The digital down converter 1500 is then fed into the combiner 1404.

To summarize, the advantages of the proposed digital virtual surface coil (magnetic resonance imaging receive coil 101, 101') may include one or more of the following:

The number of channels can be reduced to limit the bandwidth required to transfer data to the system. This is particularly useful for wireless coils where bandwidth limitations of the wireless medium are extreme.

The number of channels can be reduced up front in the surface coil to limit both memory and processing resources in subsequent stages as well as limiting network bandwidth. This reduces the degree of channel combination required in subsequent processing stages.

There is complete freedom in the number of virtual channels. In a practical implementation, the number of virtual channels will be less than the number of physical channels. This obviates the common analogue surface coil practice of providing modes in which predetermined sub sets of physical channels are selected depending (solely) on the selected field of view.

There is complete freedom in virtual channel composition. In particular, each virtual channel can be formed with an arbitrary weighted sum of physical channels. This contrasts strongly with analogue approaches where the possible combinations are predetermined at design time limiting their effectiveness for arbitrary combinations of fields of view, parallel imaging behavior and noise distribution strategies.

Channel virtualization can be based on arbitrary channel combination strategies. The combination operation is completely parameterized and programmable by external software.

Various implementation strategies that can readily be deployed on programmable (FPGA) hardware have been identified. The hardware resources required for such implementations are modest and consequently result in cost effective implementations.

A particular high channel count surface coil can be deployed on existing systems with a limited network bandwidth. This enables high channel count surface coils to be deployed without having to upgrade systems to correspondingly higher network bandwidth, increasing the number of systems in the installed base on which such surface coils can be used.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical instrument
101 magnetic resonance imaging receive antenna
101' magnetic resonance imaging receive antenna
102 antenna element
104 radio-frequency receiver 106 electronics package
108 digital combiner
110 first digital transceiver
112 digital communication channel
114 battery
200 medical instrument
202 magnetic resonance imaging system
204 magnet
206 bore of magnet
208 imaging zone
209 field of view
210 magnetic field gradient coils
212 magnetic field gradient coil power supply
214 body coil
216 RF transmitter
217 second intermediate digital communications transceiver
218 subject
220 subject support
226 computer system
228 hardware interface
230 processor
232 user interface
234 computer memory
240 machine executable instructions
242 coils sensitivity pulse sequence commands
244 coil sensitivity data
246 coil sensitivity profile
248 chosen field of view
250 chosen pulse sequence commands
252 available bandwidth limit
254 chosen number of digital virtual magnetic resonance channels
256 set of calculated weighting factors
258 magnetic resonance data
260 magnetic resonance image
300 control the magnetic resonance imaging system to measure coil sensitivity data for each of the multiple antenna elements by controlling the magnetic resonance imaging system with coil sensitivity pulse sequence commands, wherein the coil sensitivity data is received via the digital communication channel
302 determine a coil sensitivity profile for each of the multiple antenna elements using the coil sensitivity data
304 receive a chosen field of view, a chosen pulse sequence for controlling the magnetic resonance imaging system to acquire the digital magnetic resonance data, and an available bandwidth limit
306 determine the chosen number of digital virtual magnetic resonance channels using the chosen field of view, the chosen pulse sequence, and the available bandwidth limit
308 determine a set of calculated weighting factors using the chosen number of digital virtual magnetic resonance channels and the coil sensitivity profile for each of the multiple antenna elements to construct a set of virtual magnetic resonance channels
310 transmit the set of weighting factors to the magnetic resonance imaging receive antenna using the digital communication channel, wherein the magnetic resonance imaging receive antenna is configured for setting the set of calculated weighting factors as the set of weighting factors upon receipt via the digital communication channel
312 control the magnetic resonance imaging system with the chosen pulse sequence commands to acquire the magnetic resonance data
314 reconstruct a magnetic resonance image using the magnetic resonance data
400 medical instrument
402 channel noise pulse sequence commands
404 channel noise data
406 noise decorrelation coefficients
408 noise correlations
500 control the magnetic resonance imaging system to measure channel noise data for each digital magnetic resonance channel by controlling the magnetic resonance imaging system with channel noise pulse sequence commands
502 determine noise correlations between each digital magnetic resonance channel using the channel noise data
504 determine noise decorrelation coefficients for each digital magnetic resonance channel using the noise correlations
506 modify the set of calculated weighting factors with the noise decorrelation coefficients to perform a noise decorrelation using the digital combiner
600 receive coil
602 multiplexing merger
700 inputs
702 outputs
800 digital virtual magnetic resonance channels
900 virtual magnetic resonance channel
902 digital magnetic resonance data
904 set of weighting factors
1100 multiplexer
1102 sequencer
1200 Perform channel sensitivity pre-scan on all physical channels
1202 Determine Sensitivity profiles for all physical channels
1204 Field of view, Paralleled Imaging, Bandwidth Limits
1208 Load channel combination coefficients in coil
1206 Perform scan with virtualized channels
1300 Perform noise pre-scan
1302 Determine noise correlation between physical channels
1304 Derive noise decorrelation coefficients
1400 digitizer
1402 delay match
1404 combiner
1500 DDC

The invention claimed is:

1. A magnetic resonance imaging receive antenna array comprising:
multiple antenna elements each configured to receive a magnetic resonance imaging radio-frequency signal;
a radio-frequency receiver integrated with a set of multiple antenna elements, connected to each of the multiple antenna elements, wherein the radio-frequency receiver is configured to receive the magnetic resonance imaging radio frequency signal and to convert the radio frequency signal to digital magnetic resonance data;
a digital combiner integrated with the set of multiple antenna elements, wherein the digital combiner is configured to combine a weighted combination of the digital magnetic resonance data from each of the radio frequency signal into a chosen number of digital virtual magnetic resonance channels using a set of weighting factors; and a first digital communication transceiver integrated with the set of multiple antenna elements, configured to transmit the digital virtual magnetic resonance channels via a digital communication channel;

a second intermediate digital communication transceiver configured t form the digital communication channel with the first digital communication transceiver, wherein the magnetic resonance imaging system is configured to receive the digital virtual magnetic resonance channels via the digital communication channel:

a memory configured to store machine executable instructions; and a processor configured to control the medical instrument; wherein execution of the machine executable instructions causes the processor to:

control the magnetic resonance imaging system to measure coil sensitivity data for each of the multiple antenna elements by controlling the magnetic resonance imaging system with coil sensitivity pulse sequence commands, wherein the coil sensitivity data is received via the digital communication channel;

determine a coil sensitivity profile for each of the multiple antenna elements using the coil sensitivity data;

receive a chosen field of view, a chosen pulse sequence commands for controlling the magnetic resonance imaging system to acquire the digital magnetic resonance data, and an available bandwidth limit of the digital communication channel;

determine the chosen number of digital virtual magnetic resonance channels using the chosen field of view, the chosen pulse sequence, and the available bandwidth limit;

determine a set of calculated weighting factors using the chosen number of digital virtual magnetic resonance channels and the coil sensitivity profile for each of the multiple antenna elements to construct a set of virtual magnetic resonance channels; and transmit the set of calculated weighting factors to the magnetic resonance imaging receive antenna using the digital communication channel, wherein the magnetic resonance imaging receive antenna is configured to set the set of calculated weighting factors as the set of weighting factors upon receipt via the digital communication channel.

2. The magnetic resonance imaging system of claim 1, comprising multiple ones of the magnetic resonance imaging receive antennas, wherein the available bandwidth is at least partially determined by a bandwidth requirement of the multiple magnetic resonance imaging receive antennas.

3. The magnetic resonance imaging system of claim 1, wherein execution of the machine executable instructions further causes the processor to:

control the magnetic resonance imaging system with the chosen pulse sequence commands to acquire the magnetic resonance data, wherein the magnetic resonance data comprises the weighted combination of the digital magnetic resonance data received via the digital communication channel; and reconstruct a magnetic resonance image using the magnetic resonance data.

4. The magnetic resonance imaging system of claim 3, wherein execution of the machine executable instructions further causes the processor to:

control the magnetic resonance imaging system to measure channel noise data for each digital magnetic resonance channel by controlling the magnetic resonance imaging system with channel noise pulse sequence commands, wherein the channel noise data is received via the digital communication channel;

determine noise correlations between each digital magnetic resonance channel using the channel noise data; and determine noise decorrelation coefficients for each digital magnetic resonance channel using the noise correlations.

5. The medical instrument of claim 4, wherein the processor is configured such that calculating the set of calculated weighting factors to construct the set of virtual magnetic resonance channels is performed at least partially using the noise decorrelation coefficients.

6. The magnetic resonance imaging system of claim 4, wherein execution of the machine executable instructions further causes the processor to modify the set of calculated weighting factors with the noise decorrelation coefficients to perform a noise decorrelation using the digital combiner.

7. The magnetic resonance imaging system of claim 1, wherein the first digital communication transceiver and the second intermediate digital communication transceiver is configured to form the digital communication channel using any one of the following: a fiber optic cable, a wireless communication channel, a wi-fi connection, a Bluetooth connection, and a galvanic digital serial cable.

8. The magnetic resonance imaging of claim 1, wherein the magnetic resonance imaging receive antenna comprises a battery for powering the digital combiner.

9. The magnetic resonance imaging system of claim 1, wherein the
magnetic resonance imaging receive antenna is a surface antenna.

10. The magnetic resonance imaging system of claim 1, wherein the digital combiner is implemented using any one of the following: an application-specific integrated circuit, a field-programmable gate array, and a microprocessor.

11. The magnetic resonance imaging system of claim 1, wherein the weighting factors are complex.

12. A computer program product comprising machine executable instructions stored on a non-transitory computer readable medium for execution by a processor controlling a medical instrument, wherein the medical instrument comprises a magnetic resonance imaging receive antenna, wherein the magnetic resonance imaging receive antenna comprises:

multiple antenna elements each configured to receive a magnetic resonance imaging radio-frequency signal;

a radio-frequency receiver integrated with a set of multiple antenna elements, connected to each of the multiple antenna elements, wherein the radio-frequency receiver is configured to receive the magnetic resonance imaging radio frequency signal and to convert the radio frequency signal to digital magnetic resonance data;

a digital combiner integrated with the set of multiple antenna elements, wherein the digital combiner is configured to combine a weighted combination of the digital magnetic resonance data from each of the radio frequency signal into a chosen number of digital virtual magnetic resonance channels using a set of weighting factors; and a first digital communication transceiver integrated with the set of multiple antenna elements, configured to transmit the digital virtual magnetic resonance channels via a digital communication channel;
wherein the medical instrument further comprises a magnetic resonance imaging system configured to acquire magnetic resonance data from an imaging zone, wherein the magnetic resonance imaging system comprises a second intermediate digital communication transceiver configured to form the digital communication channel with the first digital communication transceiver, wherein the magnetic resonance imaging system is configured to receive the digital virtual magnetic resonance channels via the digital communication channel;
wherein execution of the machine executable instructions causes the processor to:
control the magnetic resonance imaging system to measure coil sensitivity data for each of the multiple antenna elements by controlling the magnetic resonance imaging system with coil sensitivity pulse sequence commands, wherein the coil sensitivity data is received via the digital communication channel;
determine a coil sensitivity profile for each of the multiple antenna elements using the coil sensitivity data;
receive a chosen field of view, a chosen pulse sequence commands for controlling the magnetic resonance imaging system to acquire the digital magnetic resonance data, and an available bandwidth limit;
determine the chosen number of digital virtual magnetic resonance channels using the chosen field of view, the chosen pulse sequence, and the available bandwidth limit;
determine a set of calculated weighting factors using the chosen number of digital virtual magnetic resonance channels and the coil sensitivity profile for each of the multiple antenna elements to construct a set of virtual magnetic resonance channels; and
transmit the set of calculated weighting factors to the magnetic resonance imaging receive antenna using the digital communication channel, wherein the magnetic resonance imaging receive antenna is configured to set the set of calculated weighting factors as the set of weighting factors upon receipt via the digital communication channel.

13. The computer program product of claim 12, comprising multiple ones of the magnetic resonance imaging receive antennas, wherein the available bandwidth is at least partially determined by a bandwidth requirement of the multiple magnetic resonance imaging receive antennas.

14. The computer program product of claim 12, wherein execution of the machine executable instructions further causes the processor to:
control the magnetic resonance imaging system with the chosen pulse sequence commands to acquire the magnetic resonance data, wherein the magnetic resonance data comprises the weighted combination of the digital magnetic resonance data received via the digital communication channel; and
reconstruct a magnetic resonance image using the magnetic resonance data.

15. The computer program product of claim 14, wherein execution of the machine executable instructions further causes the processor to:
control the magnetic resonance imaging system to measure channel noise data for each digital magnetic resonance channel by controlling the magnetic resonance imaging system with channel noise pulse sequence commands, wherein the channel noise data is received via the digital communication channel;
determine noise correlations between each digital magnetic resonance channel using the channel noise data; and
determine noise decorrelation coefficients for each digital magnetic resonance channel using the noise correlations.

16. The computer program product of claim 15, wherein the processor is configured such that calculating the set of calculated weighting factors to construct the set of virtual magnetic resonance channels is performed at least partially using the noise decorrelation coefficients.

17. The computer program product of claim 15, wherein execution of the machine executable instructions further causes the processor to modify the set of calculated weighting factors with the noise decorrelation coefficients to perform a noise decorrelation using the digital combiner.

18. A method of operating a magnetic resonance imaging receive antenna, wherein the magnetic resonance imaging receive antenna comprises:
multiple antenna elements each configured to receive a magnetic resonance imaging radio-frequency signal;
a radio-frequency receiver integrated with the set of multiple antenna elements, connected to each of the multiple antenna elements, wherein the radio-frequency receiver is configured to receive the magnetic resonance imaging radio frequency signal and to convert the radio frequency signal to digital magnetic resonance data;
a digital combiner integrated with the set of multiple antenna elements, wherein the digital combiner is configured to combine a weighted combination of the digital magnetic resonance data from each of the radio frequency signal into a chosen number of digital virtual magnetic resonance channels using a set of weighting factors; and
a first digital communication transceiver integrated with the set of multiple antenna elements, configured to transmit the digital virtual magnetic resonance channels via a digital communication channel;
wherein the medical instrument further comprises a magnetic resonance imaging system configured to acquire magnetic resonance data from an imaging zone, wherein the magnetic resonance imaging system comprises a second intermediate digital communication transceiver configured to forme the digital communication channel with the first digital communication transceiver, wherein the magnetic resonance imaging system is configured to receive the digital virtual magnetic resonance channels via the digital communication channel;
wherein the method comprises:
controlling the magnetic resonance imaging system to measure coil sensitivity data for each of the multiple antenna elements by controlling the magnetic resonance imaging system with coil sensitivity pulse sequence commands, wherein the coil sensitivity data is received via the digital communication channel;
determining a coil sensitivity profile for each of the multiple antenna elements using the coil sensitivity data;
receiving a chosen field of view, a chosen pulse sequence commands for controlling the magnetic resonance imaging system to acquire the digital magnetic resonance data, and an available bandwidth limit;

determining the chosen number of digital virtual magnetic resonance channels using the chosen field of view, the chosen pulse sequence, and the available bandwidth limit;

determining a set of calculated weighting factors using the chosen number of digital virtual magnetic resonance channels and the coil sensitivity profile for each of the multiple antenna elements to construct a set of virtual magnetic resonance channels; and transmitting the set of calculated weighting factors to the magnetic resonance imaging receive antenna using the digital communication channel, wherein the magnetic resonance imaging receive antenna is configured to set the set of calculated weighting factors as the set of weighting factors upon receipt via the digital communication channel.

* * * * *